United States Patent
Henrichs

(10) Patent No.: US 6,625,195 B1
(45) Date of Patent: Sep. 23, 2003

(54) VERTICAL CAVITY SURFACE EMITTING LASER THAT USES INTRACAVITY DEGENERATE FOUR WAVE MIXING TO PRODUCE PHASE-CONJUGATED AND DISTORTION FREE COLLIMATED LASER LIGHT

(76) Inventor: Joseph Reid Henrichs, 641 NE. Swann Cir., Lee's Summit, MO (US) 64086

(*) Notice: Subject to any disclaimer, the term of this patent is extended or adjusted under 35 U.S.C. 154(b) by 0 days.

(21) Appl. No.: 09/357,685

(22) Filed: Jul. 20, 1999

(51) Int. Cl.[7] .............................................. H01S 5/183
(52) U.S. Cl. ...................................................... 372/96
(58) Field of Search .............................. 372/45, 46, 50, 372/96, 92, 99

(56) References Cited

U.S. PATENT DOCUMENTS

| | | | |
|---|---|---|---|
| 4,220,928 A | 9/1980 | Bloom et al. | |
| 4,233,571 A | 11/1980 | Wang et al. | |
| 4,309,670 A | 1/1982 | Burnham et al. | |
| 4,321,550 A | 3/1982 | Evtuhov | |
| 4,493,086 A | 1/1985 | Jain et al. | |
| 4,521,075 A | 6/1985 | Obenschain et al. | |
| 4,529,273 A | 7/1985 | Cronin-Golomb et al. | |
| 4,682,340 A | 7/1987 | Dave et al. | |
| 4,794,344 A | 12/1988 | Johnson | |
| 4,837,769 A | 6/1989 | Chandra et al. | |
| 5,023,477 A | * 6/1991 | Valley et al. ................. | 372/99 |
| 5,033,054 A | 7/1991 | Sclfres et al. | |
| 5,170,407 A | 12/1992 | Schubert et al. | |
| 5,206,872 A | 4/1993 | Jewell et al. | |
| 5,255,278 A | 10/1993 | Yamanaka | |
| 5,263,041 A | * 11/1993 | Pankove ...................... | 372/45 |
| 5,341,390 A | 8/1994 | Yamada et al. | |
| 5,513,203 A | * 4/1996 | Damen ......................... | 372/96 |
| 5,729,380 A | 3/1998 | Betin et al. | |
| 5,822,356 A | * 10/1998 | Jewell .......................... | 372/46 |
| 5,982,802 A | 11/1999 | Thony et al. | |
| 6,339,607 B1 | 1/2002 | Jiang et al. | |

* cited by examiner

Primary Examiner—James Davie

(74) Attorney, Agent, or Firm—Kirkpatrick & Lockhart LLP

(57) ABSTRACT

The present invention is a "Vertical Cavity Surface Emitting Laser" or "VCSEL" design, wherein the VCSEL device produces phase-conjugated distortion free (reversal of intracavity distortions like diffraction, divergence, and light scattering) and collimated (plane-parallel phase fronts) laser-light emissions. Moreover, through what is called intracavity degenerative four-wave mixing (called four-wave mixing because traditionally there are four frequencies of phase-matched laser light involved in the phase-conjugate process), that occurs within the nonlinear materials of the "Phase Conjugated Vertical Cavity Surface Emitting Laser" or "PCVCSEL" device's vertical-cavity. Moreover, these nonlinear materials are located at the center of the PCVCSEL's vertical-cavity, wherein wave fronts produced by the PCVCSEL's two active-area laser pumps (called Pump 1 and Pump 2) will intersect with wave fronts produced by the PCVCSEL's two active-area laser probes (called Probe 1 and Probe 2), therein causing small and large spatial interference-gratings to form, which will ultimately form what is called a "phase conjugate mirror". Furthermore, the semiconductor materials used in the PCVCSEL's vertical-cavity design must exhibit a nonlinear property, called the "third order susceptibility", which is necessary for the production of a "phase conjugate mirror". In-addition, materials that exhibit nonlinear third-order susceptibilities are not limited to semiconductor materials like (GaAs) or "Gallium-Arsenide". (InAs) or "Indium-Arsenide", (InP) or "Indium-Phosphide", and (GaSb) or "Gallium-Antimonide", moreover the ternary semiconductor materials having a Cubic crystal-symmetry of class-F43m and a space-group of "216"; but are also exhibited in photo-refractive materials like (KDP) or "Potassium-Dihydrogen-Phosphate", and (ADP) or "Ammonium-Dihydrogen-Phosphate", moreover the photo-refractive materials having a Tetragonal crystal-symmetry of class-I42d and a space-group of "122". Therefore, the photo-refractive materials that also exhibit nonlinear third-order susceptibilities can also be used in the center of the PCVCSEL's vertical-cavity design for producing phase-conjugated and distortion free optical radiation emissions.

63 Claims, 14 Drawing Sheets

Section B-B

Section A-A

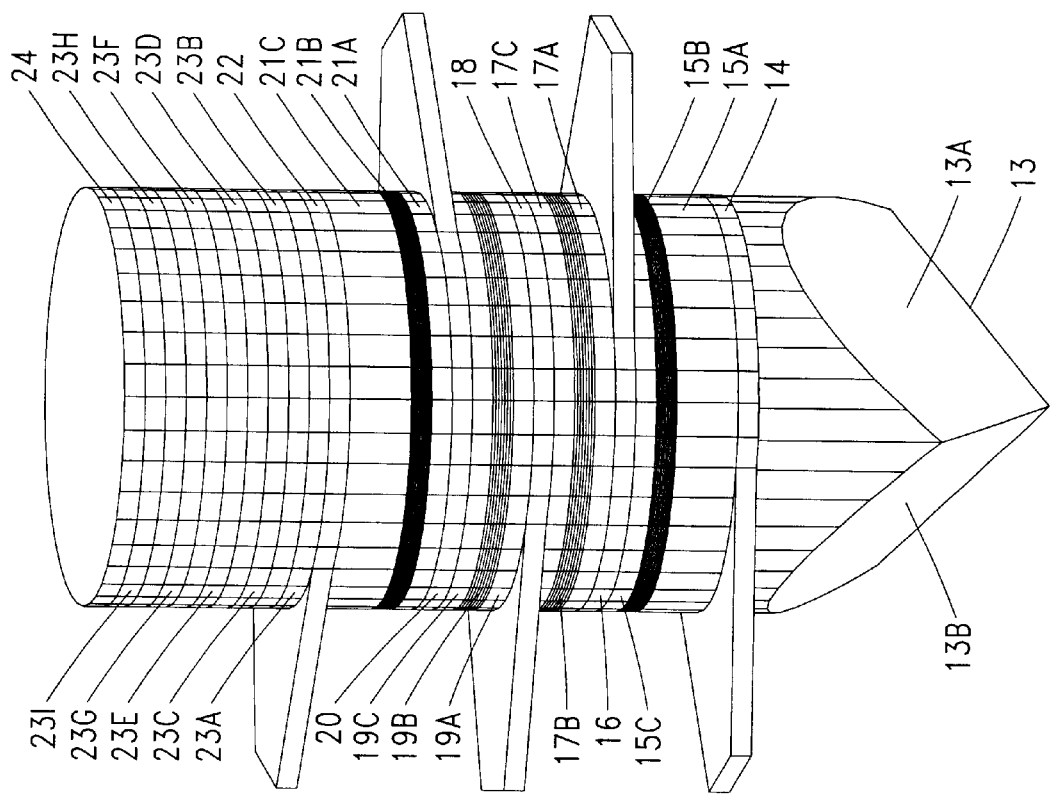
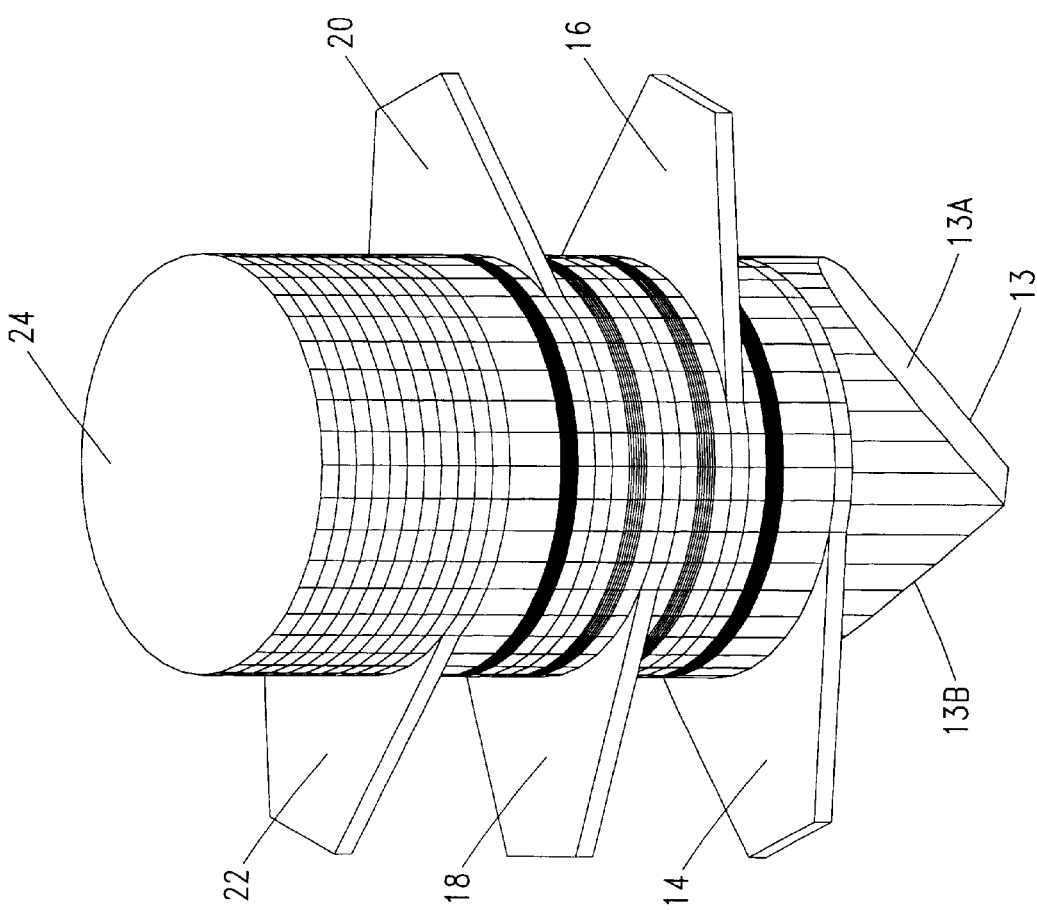

Section B-B

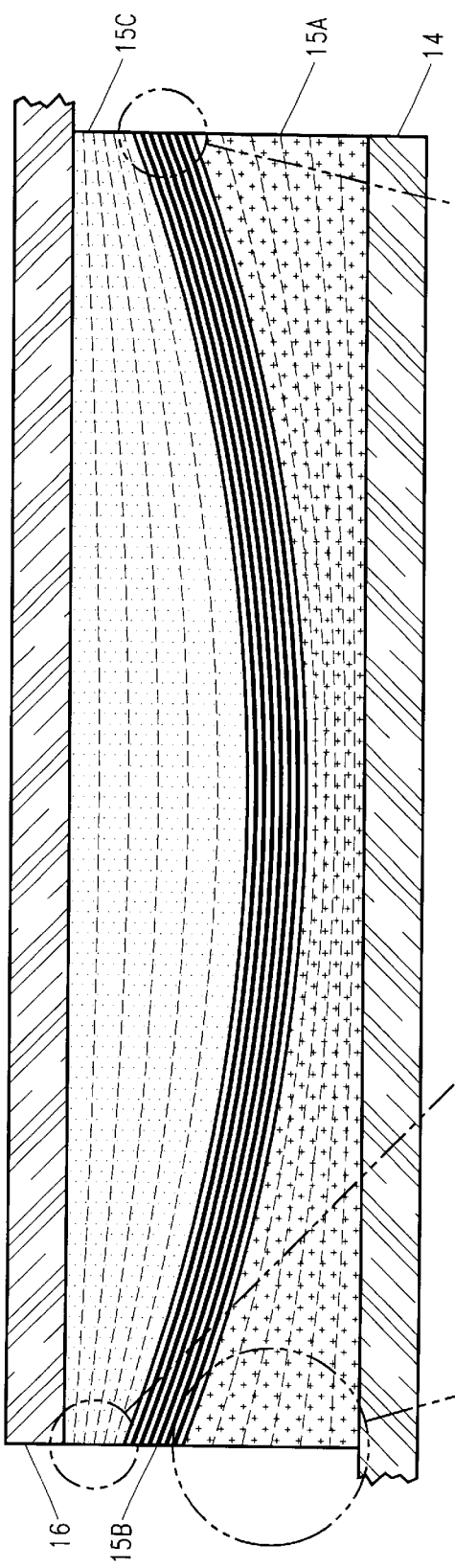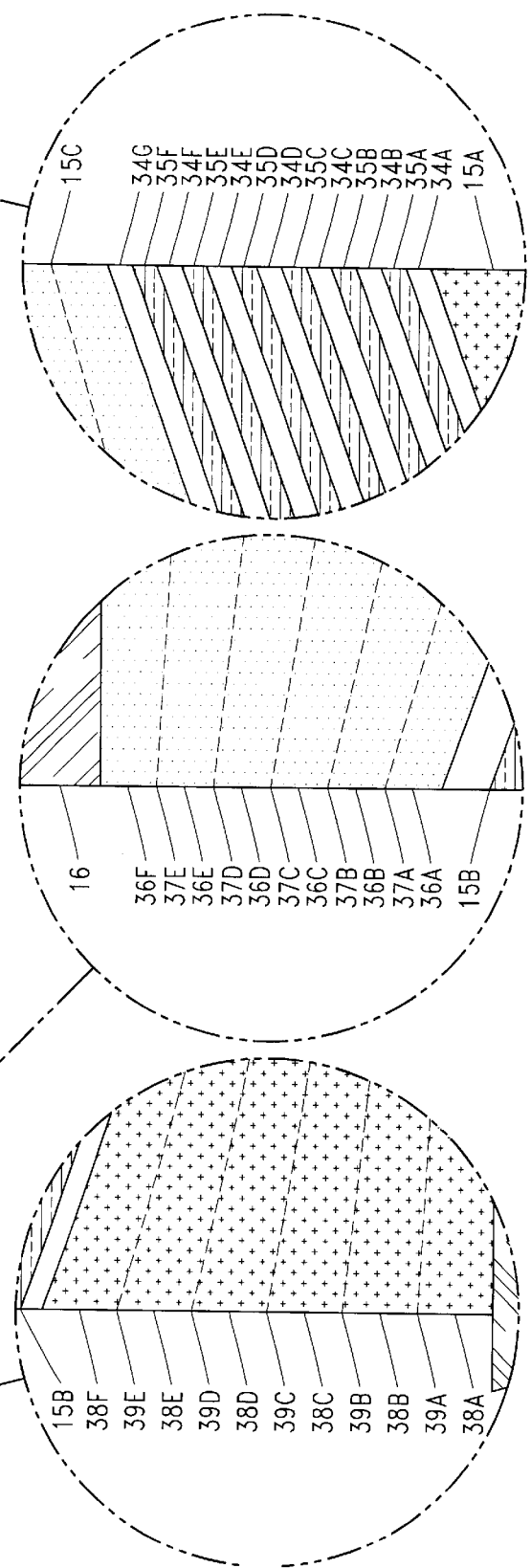

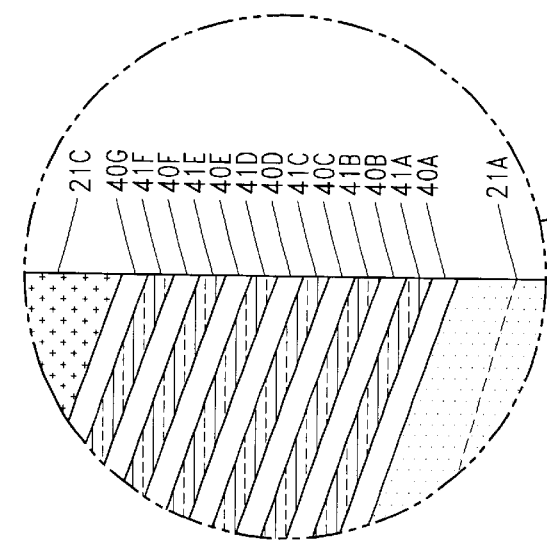
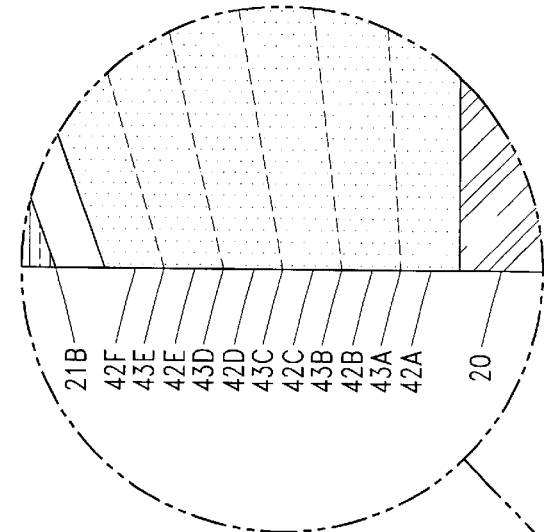
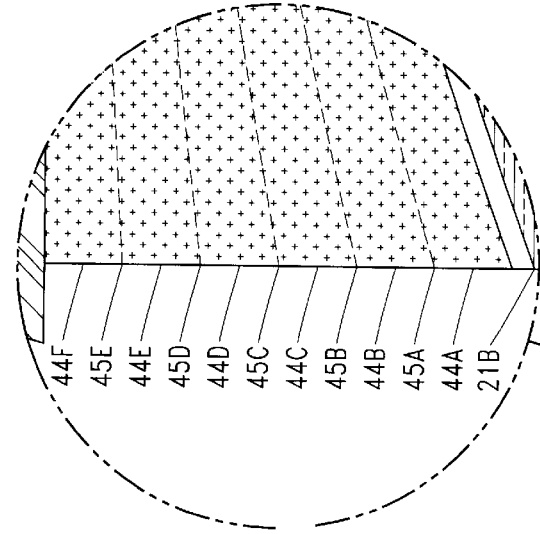
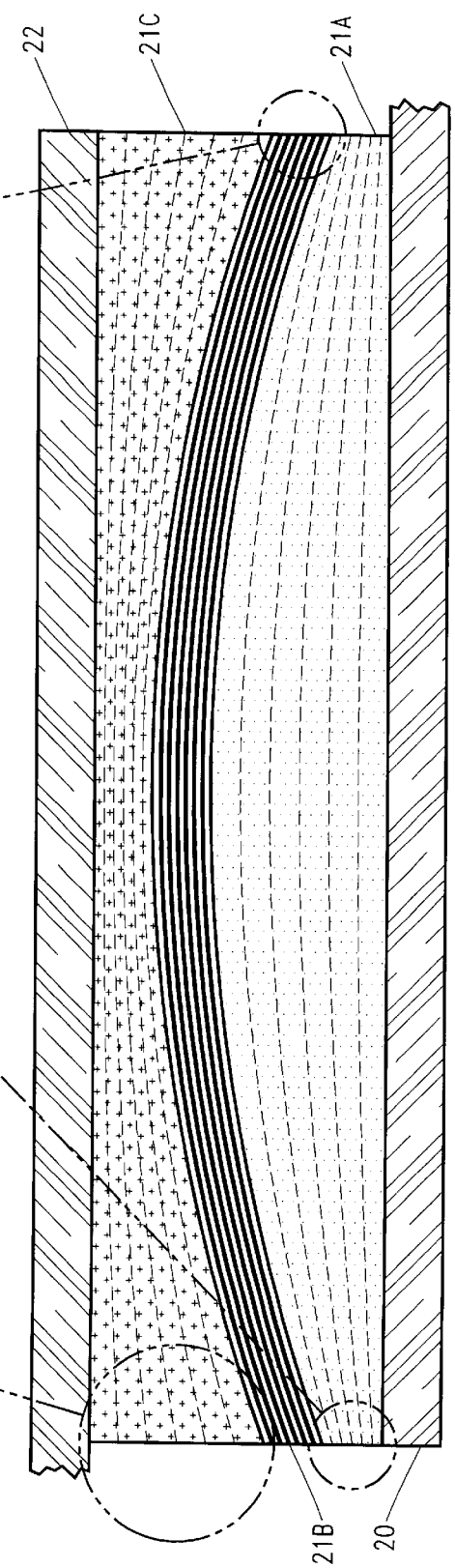

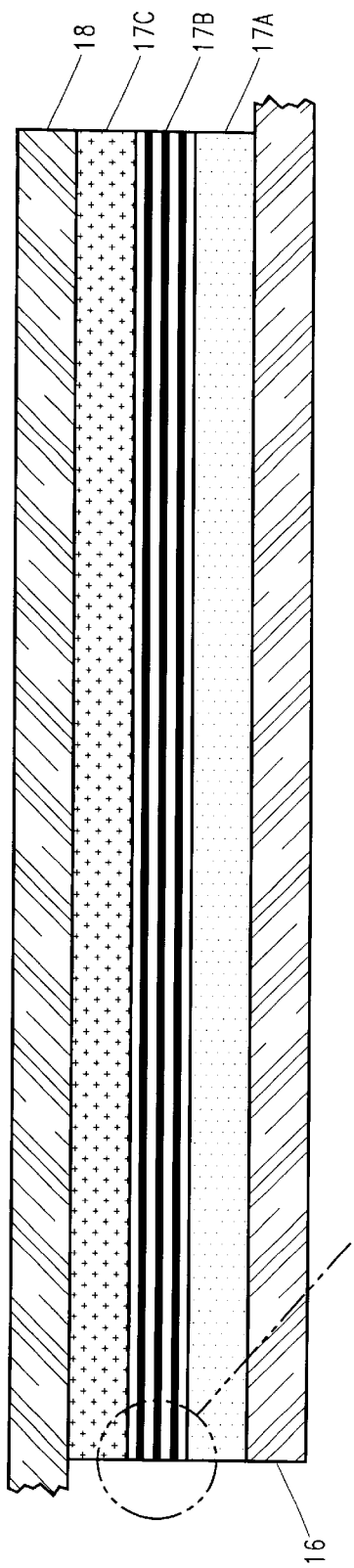
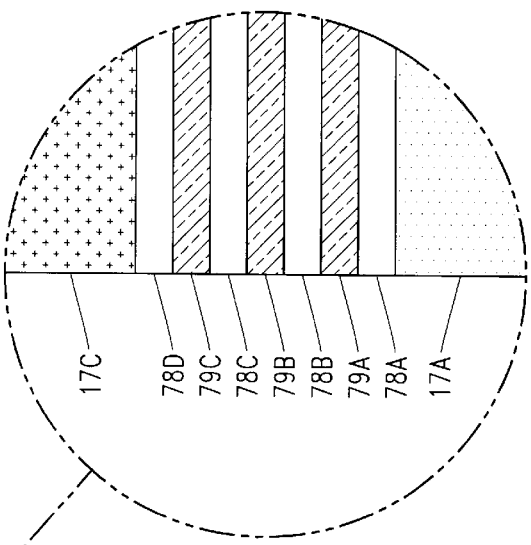
FIG.-20
FIG.-20A

VERTICAL CAVITY SURFACE EMITTING LASER THAT USES INTRACAVITY DEGENERATE FOUR WAVE MIXING TO PRODUCE PHASE-CONJUGATED AND DISTORTION FREE COLLIMATED LASER LIGHT

CROSS-REFERENCE TO RELATED APPLICATIONS

Not Available

FEDERALLY SPONSORED RESEARCH OR DEVELOPMENT

Not Available

REFERENCE TO MICROFICHE APPENDIX

Not Available

TECHNICAL FIELD OF INVENTION

This invention relates to semiconductor diode lasers, or more specifically to a semiconductor diode laser called a (VCSEL) "Vertical Cavity Surface Emitting Laser", which is a device that uses a process known as recombination radiation to produce laser-light emissions. These semiconductor diode lasers have vertical cavities, which amplify into laser emissions the photonic radiation produced by a double-heterostructure active-region. Comprised, as a multilayered vertical structure, having a substrate, an electronic and optically pumped double-heterostructure light-emitting diode active-region, and two feedback-providing contra-positioned light-reflecting structures defining a resonant cavity.

BACKGROUND OF THE INVENTION

Currently, VCSELs use, as their main photon producing structures a single double-heterostructure light emitting diode active-region. Typically, a double-heterostructure "Light Emitting Diode" (LED) is constructed from latticed-matched extrinsic semiconductor binary materials like (GaAs) "Gallium-Arsenide", (InP) "Indium-Phosphide", and (GaSb) "Gallium-Antimonide". Additionally, a double-heterostructure LED can also be constructed from latticed-matched extrinsic semiconductor ternary materials like (GaAlAs) "Gallium-Aluminum-Arsenide", or constructed from latticed-matched extrinsic semiconductor quaternary materials like (InGaAsP) "Indium-Gallium-Arsenic-Phosphide", and (InGaAsSb) "Indium-Gallium-Arsenic-Antimonide". Typically, a single double-heterostructure LED active-region will contain either a "Single Quantum Well" (SQW) active-area (i.e., used in what is sometimes called a SQW laser), which is constructed from a single extrinsic semiconductor material, or a "Multiple Quantum Well" (MQW) active-area (i.e., used in what is sometimes called a MQW laser), which is constructed from several extrinsic semiconductor materials.

In addition, recombination produced optical-radiation emitted by current VCSELs is far from ideal. For example, the coherence properties of recombination radiation emissions produced by prior-art VCSELs is most often of poor quality, with their coherence measured to be somewhere between the laser radiation emitted by a low-pressure gas laser and an incoherent line-source. Additionally, the recombination radiation produced emissions created by prior-art VCSELs is not collimated, but divergent having a total divergence of about "30" degrees from a VCSEL emitter's top-surface edge. Generally, all prior-art VCSEL designs use a cavity-external and microscopic collimating lens to correct the problem of laser beam divergence. Adjustment of a VCSEL's divergent light-rays into collimated and parallel traveling light-rays is accomplished when a cavity-external collimating lens has been located several microns from a VCSEL emitter's top horizontal surface.

Furthermore, to correct current VCSEL laser beam incoherence and laser beam divergence problems a new type of VCSEL design is required. Therefore, any problems presented above are substantially solved by the present invention, while any purposes presented above are realized as well in the present invention's Phase Conjugated Vertical Cavity Surface Emitting Laser design, which is described in greater detail within the preferred embodiments written below.

SUMMARY OF THE INVENTION

In accordance with the present invention, a Phase Conjugated Vertical Cavity Surface Emitting Laser comprises a cavity folding corner-cube shaped prism waveguide having three internal reflecting prisms that provide a cavity folding transverse redirection, polarity stabilization, and a retro-reflection of intracavity produced fundamental photonic radiation; four electrically unisolated double-heterojunction LED structures constructed from interference forming non-linear semiconductor materials (e.g., Gallium-Arsenide, Indium-Gallium-Arsenide, and/or Aluminum-Gallium-Arsenide) that will provide electronic production, optical amplification, and phase conjugated reflection of intracavity produced fundamental photonic radiation; and a partial reflecting feedback providing mirror structure capable of reflecting a sufficient amount of undiffused intracavity produced optical radiation into the laser's nonlinear and laser-active semiconductor material for further amplification, while providing an apparatus that produces frequency-selected output of wavelength-specific monochromic and amplified photonic radiation.

Objects and Advantages

Accordingly, besides the objects and advantages of a phase conjugated vertical-cavity surface-emitting laser described in the above patent, several other objects and advantages of the present invention are:

(a) To provide a phase conjugated vertical-cavity surface-emitting laser that creates a high output of narrow-linewidth amplified light using a cavity folding internal reflecting corner-cube shaped prism waveguide comprised from a single layer of optically transparent material;

(b) To provide a phase conjugated vertical-cavity surface-emitting laser that is inexpensive to manufacture, because it has eliminated the expensive epitaxial deposition of a primary quarterwave mirror stack assembly comprised as an multitude of quarterwave thick epitaxial deposited alternating layers that are constructed from refractive opposing materials and replaced it with a single corner-cube shaped prism waveguide, which is constructed from a single inexpensive layer of sputter or epitaxially deposited optically transparent material;

(c) To provide a phase conjugated vertical-cavity surface-emitting laser that uses two graded confinement cladding-layers to generate higher-output of laser emissions;

(d) To provide a phase conjugated vertical-cavity surface-emitting laser, which produces a more effective output gain by using two graded confinement cladding-layers within each active-region to lower the heat produced by electrical resistance that occurs between current conducting contact-layers and their adjacent cladding-layers;

(e) To provide a phase conjugated vertical-cavity surface-emitting laser, which increases optical confinement with the addition of total internal reflecting cladding material to the surrounding vertical and outermost wall surfaces of the phase conjugated vertical-cavity surface-emitting laser's folded vertical-cavity(s);

(f) To provide a phase conjugated vertical-cavity surface-emitting laser, which can be configured and controlled as a single phase conjugated vertical-cavity surface-emitting laser device;

(g) To provide a phase conjugated vertical-cavity surface-emitting laser, which can be configured as a single phase conjugated vertical-cavity surface-emitting laser-array comprising a multitude of phase conjugated vertical-cavity surface-emitting lasers, which can be controlled as a single group of phase conjugated vertical-cavity surface-emitting lasers or controlled as a single group of independently controlled phase conjugated vertical-cavity surface-emitting lasers;

(h) To provide a phase conjugated vertical-cavity surface-emitting laser or a phase conjugated vertical-cavity surface-emitting laser-array, which can be manufactured at the same time, as a single integrated semiconductor device, using the same semiconductor and substrate material used to construct the laser-array's control-circuitry;

(j) To provide a phase conjugated vertical-cavity surface-emitting laser, which replaces a primary quarterwave mirror-stack assembly with a cornercube prism waveguide, if comprised of quartz or fused silica, will totally reflect one-hundred percent all frequencies of optical radiation that enters the waveguide's top horizontally-flat front-face surface;

(k) To provide a phase conjugated vertical-cavity surface-emitting laser, which inexpensively constructs its corner-cube shaped prism waveguide using a well-known reactive ion-milling process to slice out the waveguide's prism facet(s);

(l) To provide a phase conjugated vertical-cavity surface-emitting laser that can deposit a dielectric material like fused-silica onto any construction material that might be used to construct any frequency producing semiconductor diode or combination thereof that could possibly be used to construct a phase conjugated vertical-cavity surface-emitting laser or a phase conjugated vertical-cavity surface-emitting laser-array;

(m) To provide a phase conjugated vertical-cavity surface-emitting laser, which uses an amorphous material like "Lithium-Fluoride" (LiF) to create an optical cladding-layer, which is deposited around each vertical-cavity or cavities of each phase conjugated vertical-cavity surface-emitting laser, creating a structure providing for the total internal reflection of intracavity produced light, thermal dispersive, and additional support to a phase conjugated vertical-cavity surface-emitting laser's corner-cube prism waveguide structure(s);

(n) To provide a phase conjugated vertical-cavity surface-emitting laser, which increases its output, while maintaining a narrow line-width for its output emissions(s);

(o) To provide a phase conjugated vertical-cavity surface-emitting laser that can use an intracavity four-wave mixing geometry that promotes the production of distortion and dispersion free high-power laser output emissions;

(p) To provide a phase conjugated vertical-cavity surface-emitting laser that can use an intracavity six-wave mixing geometry that promotes the production of distortion and dispersion free high-power laser output emissions;

(q) To provide a phase conjugated vertical-cavity surface-emitting laser that uses two concave shaped active-regions and two planar shaped active-regions to successfully implement intracavity four-wave mixing to promote within the laser's vertical-cavity the production of a phase conjugated mirror;

(r) To provide a phase conjugated vertical-cavity surface-emitting laser, which will produce an increase of nearly 15-mW to its output emissions;

(s) To provide a phase conjugated vertical-cavity surface-emitting laser, which increases gain to its laser emission output by using a nonlinear laser-active gain medium material like Gallium-Arsenide in the construction of its four active-region double-heterostructure LEDs.

Further objects and advantages are provided below for the present inventions phase conjugated vertical-cavity surface-emitting laser. While, the selection of one semiconductor or optical material over another for use in the construction of a PCVCSEL's active-regions, corner-cube prism waveguide, and quarterwave mirror-stack assembly is not determined by any structural need or lattice compatibility, but is determined by a particular application's need for laser output of a specific wavelength. The materials used in the construction of the present invention are presented here only as the preferred example of a group of several wavelength specific materials that might be used in the construction of the present invention's wavelength transcendent multi-layered structures. A PCVCSEL's novel features and un-obvious properties lay within its 'phase-conjugating' structures, and because they can exist and/or can occur using different wavelength specific semiconductor and/or optical materials shows that the various structures that comprise a PCVCSEL have sufficient novelty and a non-obviousness that is independent of any one particular semiconductor or optical material that might or could be used in its construction.

Still further, objects and advantages will become apparent from a consideration of the ensuing description and drawings.

An additional object, used in the present invention is an internal reflecting corner-cube prism waveguide, which can be constructed, for example, from (SiO2) "Fused Silica" a material that retro-reflects "100" percent any optical radiation with a wavelength between "150" nanometers and "4" micrometers that enters its top front-face surface. A corner-cube prism waveguide is exactly what its name implies, a waveguide having the shape of a cube's corner that is cut off orthogonal to one of its triad (i.e., body-diagonal) axes, which uses internal reflection as its means for redirecting optical radiation. Wherein, the front-face surface of the resultant prism waveguide would typically have the shape of the invention's vertical-cavity, and plane-parallel to a PCVCSEL's secondary reflector, which typically comprises of an epitaxially deposited quarterwave mirror-stack assembly constructed from optical materials of opposed refractive indices.

Moreover, as the result of three totally internal reflections, a corner-cube's three prism facets form a waveguide that redirects any incident light-rays backward toward their original direction no matter what angle of incidence the previously mentioned light-rays had when they entered the front-face surface of the corner-cube prism waveguide. Retro-reflected light-rays are shifted laterally by an amount that depends on a light-ray's angle of incidence and point of entry upon the front-face surface of the corner-cube prism waveguide. The location of the internal retro-reflecting corner-cube prism waveguide is at the base of a PCVCSEL's vertical-cavity. Furthermore, not only does the corner-cube prism waveguide replace the primary quarterwave DBR mirror-stack assembly normally used in current prior-art VCSEL designs with a structure comprising of a single layer, but with a structure that also functions to stabilize the polarity of a PCVCSEL's laser-light output emissions, An additional object, used in the present invention is the symmetry and layout of a PCVCSEL's four electrically un-isolated active-regions and the other layered materials that make up the rest of its vertical-cavity. It should be understood, however, that the process of intracavity four-wave mixing in the production of phase-conjugation and its distortion removing properties can be created using any wavelength of optical radiation made possible through existing semiconductor diode laser technologies.

Consequently, since the phase-conjugation process is independent of any particular wavelength of optical radiation it must also be independent of any particular wavelength determined material as well. Therefore, the choice between semiconductor materials used in a PCVCSEL's construction is presented here only to show that the PCVCSEL's design has sufficient novelty.

In addition, is a PCVCSEL's first contact-layer, which is constructed from a highly p+doped (GaAs) "Gallium-Arsenide" binary material, and located above the top outermost surface of the PCVCSEL's corner-cube prism waveguide's normal horizontal and circular front-face surface.

In addition, is a PCVCSEL's first cladding-layer, which is constructed from a P-doped concentrically-graded (GaAlAs) "Gallium-Aluminum-Arsenide" ternary material, and epitaxially deposited upon the top outermost surface of the PCVCSEL's first contact-layer.

In addition, is a PCVCSEL's first active-area (i.e., called pump 1), which is comprised either as a "Single Quantum Well" (SQW) constructed from (GaAs) "Gallium-Arsenide", or as a "Multiple Quantum Well" (MQW) having six quantum wells constructed from (GaAs) "Gallium-Arsenide" and seven quantum well cladding-layers constructed from (GaAlAs) "Gallium-Aluminum-Arsenide". The layers that makeup the active-area's MQW are to be epitaxially deposited, one layer upon the other, using the top outermost surface of the PCVCSEL's first cladding-layer to commence deposition.

In addition, is a PCVCSEL's second cladding-layer, which is constructed from a concentrically-graded N-doped (GaAlAs) "Gallium-Aluminum-Arsenide" ternary material, and epitaxially deposited upon the top outermost surface of the last layer comprising the PCVCSEL's first active-area (i.e., called pump 1).

In addition, is a PCVCSEL's second contact-layer, which is comprised from a highly n+ doped (GaAs) "Gallium-Arsenide" binary material, and epitaxially deposited upon the top outermost surface of the PCVCSEL's second cladding-layer.

In addition, is a PCVCSEL's third cladding-layer, which is constructed from a concentrically-graded N-doped (GaAlAs) "Gallium-Aluminum-Arsenide" ternary material, and epitaxially deposited upon the top outermost surface of the PCVCSEL's second contact-layer.

In addition, is a PCVCSEL's second active-area (i.e., called probe 1), which is comprised either as a "Single Quantum Well" (SQW) constructed from (GaAs) "Gallium-Arsenide", or as a "Multiple Quantum Well" (MQW) having three quantum wells constructed from (GaAs) "Gallium-Arsenide" and four quantum well cladding-layers constructed from (GaAlAs) "Gallium-Aluminum-Arsenide". The seven coplanar layers that makeup a active-area's MQW are to be epitaxially deposited, one layer upon the other, using the top outermost surface of the PCVCSEL's third cladding-layer to commence deposition, In addition, is a PCVCSEL's fourth cladding-layer, which is constructed from a concentrically-graded P-doped (GaAlAs) "Gallium-Aluminum-Arsenide" ternary material, and epitaxially deposited upon the top outermost surface of the last layer comprising the PCVCSEL's second active-area (i.e., called probe 1).

In addition, is a PCVCSEL's third contact-layer, which is constructed from a highly p+doped (GaAs) "Gallium-Arsenide" binary material, and epitaxially deposited upon the top outermost surface of the PCVCSEL's fourth cladding-layer.

In addition, is a PCVCSEL's fifth cladding-layer, which is constructed from a concentrically-graded P-doped (GaAlAs) "Gallium-Aluminum-Arsenide" ternary material, and epitaxially deposited upon the top outermost surface of the PCVCSEL's third contact-layer, In addition, is a PCVCSEL's third active-area (i.e., called probe 2), which is comprised either as a "Single Quantum Well" (SQW) constructed from (GaAs) "Gallium-Arsenide", or as a "Multiple Quantum Well" (MQW) having three quantum wells constructed from (GaAs) "Gallium-Arsenide" and four quantum well cladding-layers constructed from (GaAlAs) "Gallium-Aluminum-Arsenide". The seven coplanar layers that makeup an active-area's MQW are to be epitaxially deposited, one layer upon the other, using the top outermost surface of the PCVCSEL's fifth cladding-layer to commence deposition.

In addition, is a PCVCSEL's sixth cladding-layer, which is constructed from a concentrically-graded N-doped (GaAlAs) "Gallium-Aluminum-Arsenide" ternary material, and epitaxially deposited upon the top outermost surface of the last layer comprising the PCVCSEL's third active-area (i.e., called probe 2).

In addition, is a PCVCSEL's fourth contact-layer, which is constructed from a highly n+doped (GaAs) "Gallium-Arsenide" binary material, and epitaxially deposited upon the top outermost surface of the PCVCSEL's sixth cladding-layer.

In-addition, is a PCVCSEL's seventh cladding-layer, which is constructed from a N-doped concentrically-graded (GaAlAs) "Gallium-Aluminum-Arsenide" ternary material, and epitaxially deposited upon the top outermost surface of the PCVCSEL's fourth contact-layer, In addition, is a PCVCSEL's fourth active-area (i.e., called pump 2), which is comprised either as a "Single Quantum Well" (SQW) constructed from (GaAs) "Gallium-Arsenide", or as a "Multiple Quantum Well" (MQW) having six quantum wells constructed from (GaAs) "Gallium-Arsenide" and seven quantum well cladding-layers constructed from (GaAlAs) "Gallium-Aluminum-Arsenide". The thirteen layers that makeup an active-area's MQW are to be epitaxially deposited, one layer upon the other, using the top outermost surface of the PCVCSEL's fourth cladding-layer to commence deposition.

In addition, is a PCVCSEL's eighth cladding-layer, which is constructed from a concentrically-graded P-doped (GaAlAs) "Gallium-Aluminum-Arsenide" ternary material, and epitaxially deposited upon the top outermost surface of the last layer comprising the PCVCSEL's fourth active-area (i.e., called pump 2).

In addition, is a PCVCSEL's fifth contact-layer, which is comprised from a highly p+ doped (GaAs) "Gallium-Arsenide" binary material, and epitaxially deposited upon the top outermost surface of the PCVCSEL's eighth cladding-layer.

In addition, is a semi-reflecting quarterwave DBR mirror-stack assembly, which is made from a plurality of alternating layers, or more specifically a plurality of one or more layers of (SiO2) "Fused Silica" and one or more layers of (ZnO) "Zinc-Oxide". For example, a layer of (SiO2) "Fused Silica" is epitaxially deposited upon the top outermost surface of a PCVCSEL's fifth and last contact-layer. Additionally, with a layer (ZnO) "Zinc-Oxide" subsequently and epitaxially deposited upon the top outermost surface of the previously deposited (SiO2) "Fused Silica" layer; thereby, making a mirror pair of (SiO2/ZnO) reflectors.

Furthermore, if additional mirror-pairs are required, several more layers of additional mirror-pairs can be deposited upon the existing layers of (SiO2) "Fused Silica" and (ZnO) "Zinc-Oxide". The plurality of alternating layers that make-up a PCVCSEL's quarterwave DBR mirror-stack assembly is formed from one mirror pair to ten mirror pairs, with a preferred number of mirror pairs ranging from four to five mirror pairs.

An additional object of the present invention is its ability to create phase-conjugated, convergent, distortion free (i.e., reversal of intracavity distortions like diffraction, divergence, and light-scattering), and collimated (i.e., plane-parallel phase fronts) laser output emissions. Accomplished, using what is called intracavity degenerative four-wave mixing (i.e., called four-wave mixing because there are four separate frequencies of phase-matched laser light involved in the phase-conjugate process that occurs within the present invention), which occurs within the thin nonlinear semiconductor materials used to construct a PCVCSEL's double-heterostructure active-region diodes.

Moreover, the previously mentioned nonlinear semiconductor materials are naturally located at the center of a PCVCSEL's vertical-cavity, where wave-fronts produced by the PCVCSEL's two laser pumps (i.e., called Pump 1 and Pump 2) will intersect with wave-fronts produced by the PCVCSEL's two laser probes (i.e., called Probe 1 and Probe 2) causing to form therein, small and large spatial interference-gratings, which will ultimately form within the PCVCSEL's vertical-cavity what is sometimes called 'a phase-conjugate mirror'.

Furthermore, the semiconductor materials used in constructing a PCVCSEL's vertical-cavity must exhibit a nonlinear property called "third-order susceptibility", which is necessary for the production of a "phase-conjugate mirror". Additionally, materials that exhibit nonlinear third-order susceptibilities are not limited to semiconductors like (GaAs) "Gallium-Arsenide", (InAs) "Indium-Arsenide", (InP) "Indium-Phosphide", and (GaSb) "Gallium-Antimonide"; binary semiconductor materials that have the Cubic crystal-symmetry of 'class-F43m' and a space-group of "216".

Moreover, nonlinear third-order susceptibilities are also exhibited in photo-refractive materials like (KDP) "Potassium-Dihydrogen-Phosphate", and (ADP) "Ammonium-Dihydrogen-Phosphate"; photo-refractive materials that have the Tetragonal crystal-symmetry of 'class-142d' and a space-group of "122".

Therefore, photo-refractive materials exhibiting nonlinear third-order susceptibilities can also be deposited at the center of a PCVCSEL's vertical-cavity and used as the nonlinear material that produces phase-conjugated, convergent, and distortion free laser output emissions.

BRIEF DESCRIPTIONS OF THE DRAWINGS

In the drawings, closely related figures have the same number, but different alphabetic suffixes:

FIG. 7 is a "60" degree 3D isometric top side-view drawing of mesaetched PCVCSEL, illustrating four MQW active-regions, one plane-parallel mirror-stack assembly, and one internal reflecting corner-cube prism waveguide.

FIG. 8 is a "30" degree 3D isometric top side-view drawing of mesaetched PCVCSEL, illustrating four MQW active-regions, one plane-parallel mirror-stack assembly, and one internal reflecting corner-cube prism waveguide.

FIG. 18 is a close-up sectional view drawing of a PCVCSEL's first active-region (i.e., called Pump 1).

FIG. 18A is an auxiliary close-up sectional view drawing of a PCVCSEL's first active-area, displayed edge-on at its circumference.

FIG. 18B is an auxiliary close-up sectional view drawing of a PCVCSEL's second cladding-layer, displayed edge-on at its circumference.

FIG. 18C is an auxiliary close-up sectional view of a PCVCSEL's first cladding-layer, displayed edge-on at its circumference.

FIG. 19 is a close-up sectional view drawing of a PCVCSEL's fourth active-region (i.e., called Pump 2).

FIG. 19A is an auxiliary close-up sectional view drawing of a PCVCSEL's eighth cladding-layer, displayed edge-on at its circumference.

FIG. 19C is an auxiliary close-up sectional view drawing of a PCVCSEL's fourth active-area, displayed edge-on at its circumference.

FIG. 19B is an auxiliary close-up sectional view drawing of a PCVCSEL's cladding-layer, displayed edge-on at its circumference.

FIG. 20 is a close-up sectional view drawing of a PCVCSEL's second active-region (i.e., called Probe 1).

FIG. 20A is auxiliary close-up sectional view drawing of a PCVCSEL's active-area, displayed edge-on at its circumference.

REFERENCE NUMERALS IN DRAWINGS

Figure 1:
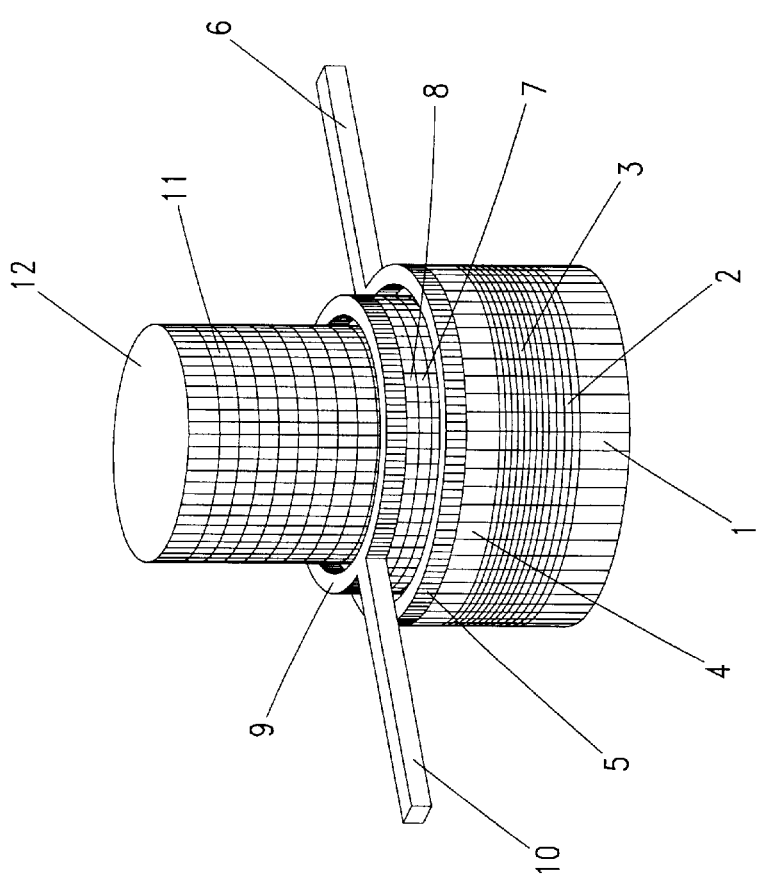
FIG. 1 is a "60" degree 3D isometric top side-view drawing of a mesaetched VCSEL having one active-region and two plane parallel Bragg reflectors, shown as prior-art.

In the drawings, closely related reference numerals have the same number but different alphabetic suffixes (i.e., not shown below):

01 prior-art substrate,
02 prior-art buffer-layer.
03 prior-art first quarterwave mirror stack assembly.
04 prior-art +n-doped contact-layer.
05 prior-art n-metal contact-ring.
06 prior-art n-metal contact.
07 prior-art active-area comprised as a SQW or MQW.
08 prior-art +p-doped contact-layer.
09 prior-art p-metal contact-ring.
10 prior-art p-metal contact.
11 prior-art second quarterwave mirror stack assembly.
12 prior-art emitter layer.
13 corner-cube shaped prism waveguide,
14 first +n-doped contact-layer.
15 first active-area comprised as a SQW or MQW (i.e., pump 1).
16 first +p-doped contact-layer.
17 second active-area comprised as a SQW or MQW (i.e., probe 1).
18 second +n-doped contact-layer.
19 third active-area comprised as a SQW or MQW (i.e., probe 2).
20 second +p-doped contact-layer.
21 fourth active-area comprised as a SQW or MQW (i.e., pump 2).
22 third +n-doped contact-layer.
23 first and only quarterwave mirror stack assembly.
24 emitter layer.
25 optical cladding material.
26 grating produced phase conjugate mirror.
27 light-rays created by active-region four (i.e., pump 2).
28 light-rays created by active-region one (i.e., pump 1).
29 light-rays created by active-region two (i.e., probe 1).
30 light-rays created by active-region four (i.e., pump 2).
31 light-rays reflected to corner-cube prism by phase conjugate mirror.
32 light-rays created by active-region three (i.e., probe 2).
33 light-ray traveling through corner-cube prism waveguide.
34 first active-area's quantum well cladding-layers.
35 first active-area's quantum wells.
36 second cladding-layer's boundary areas of gradual gradient change.
37 second cladding-layer's boundary lines of gradual gradient change.
38 first cladding-layer's boundary areas of gradual gradient change.
39 first cladding-layer's boundary lines of gradual gradient change.
40 fourth active-area's quantum well cladding-layers,
41 fourth active-area's quantum wells.
42 seventh cladding-layer's boundary areas of gradual gradient change.
43 seventh cladding-layer's boundary lines of gradual gradient change.
44 eighth cladding-layer's boundary areas of gradual gradient change.
45 eighth cladding-layer's boundary lines of gradual gradient change.
46 pump 1 for prior-art four-wave mixing.
47 pump 2 for prior-art four-wave mixing.
48 probe 1 for prior-art four-wave mixing.
49 probe 2 for prior-art four-wave mixing.
50 nonlinear medium for prior-art four-wave mixing.
51 spatial-gratings for prior-art four-wave mixing .
52 conjugate laser-beam 2 for prior-art four-wave mixing.
53 probe laser-beam 2 for prior-art four-wave mixing.

54 probe laser-beam 1 for prior-art four-wave mixing.
55 conjugate laser-beam 1 for prior-art four-wave mixing.
56 pump laser-beam 1 far prior-art four-wave mixing.
57 pump laser-beam 2 for prior-art four-wave mixing.
58 location of z=0 for prior-art nonlinear medium.
59 location of z=1 for prior-art nonlinear medium.
60 pump 1 for present invention four-wave mixing.
61 pump 2 for present invention four-wave mixing.
62 probe 1 for present invention four-wave mixing.
63 probe 2 for present invention four-wave mixing.
64 non linear medium for present invention four-wave mixing.
65 spatial-gratings for present invention four-wave mixing.
66 location of z=1 for present invention nonlinear medium.
67 location of z=0 for present invention nonlinear medium.
68 pump laser-beam 1 for present invention four-wave mixing.
69 pump laser-beam 2 for present invention four-wave mixing.
70 probe laser-beam 1 for present invention four-wave mixing,
71 probe laser-beam 2 for present invention four-wave mixing.
72 conjugate laser-beam 1 for present invention four-wave mixing,
73 conjugate laser-beam 2 for present invention four-wave mixing.
74 total-reflecting mirror for present invention four-wave mixing.
75 partial-reflecting mirror for present invention four-wave mixing.
76 laser light reflected by partial-reflecting mirror.
77 laser light reflected by total-reflecting mirror.
78 second active-area's quantum well cladding-layers.
79 second active-area's quantum Wells.
80 third active-area's quantum well cladding-layers.
81 third active-area's quantum wells,

DESCRIPTION—PREFERRED EMBODIMENT

Figure 2:
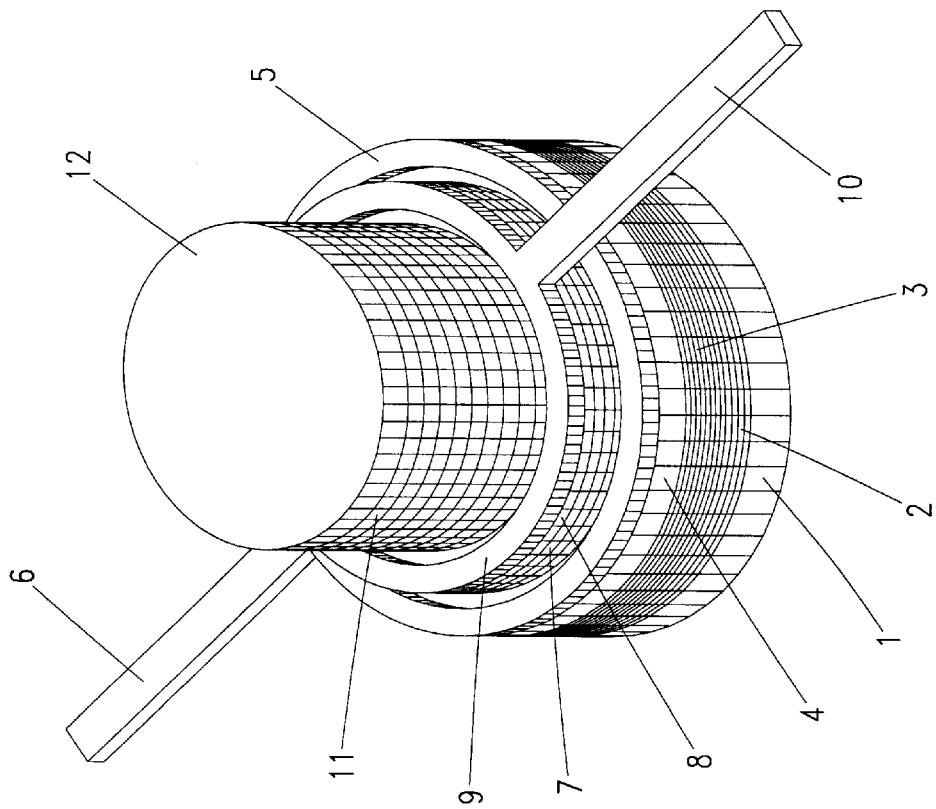
FIG. 2 is a "30" degree 3D isometric top side-view drawing of a mesaetched VCSEL having one active-region and two plane parallel Bragg reflectors, shown as prior-art.

In order to better understand the differences between the PCVCSEL design and currently used prior-art VCSEL designs, examples of prior-art VCSEL design are presented in FIGS. 1 and 2 as 3D as isometric top side-view drawings, which illustrate a VCSEL technology that uses (e-h) "electron/hole" recombination radiation to urge the production of laser light emissions having a wavelength range between "200" to "850" nanometers.

Figure 3:
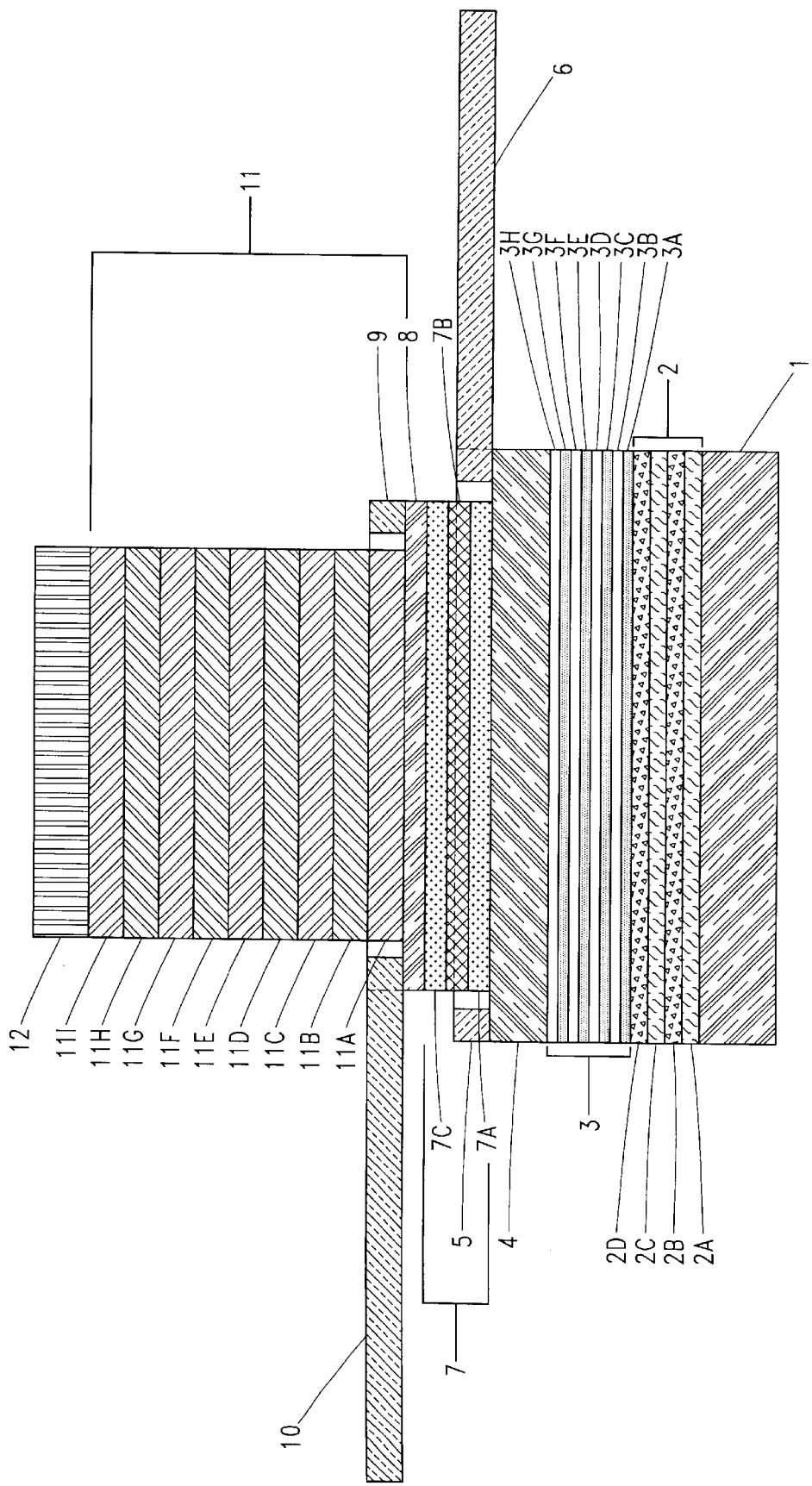
FIG. 3 is an orthographic side-view section "A—A" drawing of a mesaetched VCSBL, illustrated as having one active-region and two plane parallel Bragg reflectors, while displaying the VCSEL's multi-layered structures and design configurations, shown as prior-art.

Furthermore, as illustrated in FIG. 3, an "A—A" cross-section of an prior-art VCSEL design displays different extrinsic semiconductor layers as various horizontally deposited material levels, which are built-up layer upon layer using existing (MBE) "Molecular Beam Epitaxy" or (MOVPE) "Metal-Organic Vapor-Phase Epitaxy" manufacturing methods.

In addition, currently used prior-art VCSEL devices typically have a metallic supporting substrate, which is used as a back-reflector mirror, while providing a base-structure for the MBE and/or MOVPE growth of the prior-art VCSEL laser device 1 (FIGS. 1, 2, and 3). This metallic base-structure 1 (FIGS. 1, 2, and 3), while conductive, as an alternative embodiment also serves as an electrode, which is composed of a (Ni-Al) "Nickel-Aluminum" alloy-mixture having between a "8.0" to "12.0" percent material lattice-mismatch, more specifically a "10" percent material lattice-mismatch to (GaN) "Gallium-Nitride" binary semiconductor materials.

Nevertheless, (Ni—Al) "Nickel-Aluminum" is the preferred alloy-mixture for this kind of metallic base-structure, therein having a surface roughness of less than "15" atoms thick, the (Ni—Al) "Nickel-Aluminum" alloy-mixture exhibits a highly reflective property.

In addition, as illustrated in FIG. 3, is a layer-by-layer MBE and/or MOVPE growth of an (AlN) "Aluminum-Nitride" material, while being only a few atoms thick can also be utilized as a buffer layer 2 (FIGS. 1, 2, and 3) for facilitating the MBE and/or MOVPE growth of the many subsequent material layers that will eventually comprise a mesa-etched prior-art VCSEL device.

In addition, as shown by prior-art a short-wavelength VCSEL design will have its first "Distributed Bragg Reflector" (DBR) mirror-stack assembly 3 (FIGS. 1, 2, and 3) grown epitaxially upon the top outermost surface of the last layer comprising a multi-layered buffer 2 (FIGS. 1, 2, and 3) using any suitable epitaxial deposition method, such as the MBE and/or MOVPE growth methods. For example, a primary quarterwave DBR mirror-stack assembly, as shown in prior-art VCSEL design 3 (FIGS. 1, 2, and 3), would be composed of alternating layers of n-doped (GaN) "Gallium-Nitride" 3A (FIG. 3) and N-doped (AlGaN) "Aluminum Gallium Nitride" 3B (FIG. 3); thereby, making a mirror pair or one pair of (AlGaN/GaN) mirror-stacks, or more precisely these two alternating refractive material layers would complete one "mirror-pair".

Moreover, if additional mirror pairs are required, several more layers can be epitaxially deposited upon the top outermost surface of the last existing mirror pair's topmost layer producing therein, additional mirror pairs, while the preferred number of mirror pairs will range from five to ten mirror pairs per mirror-stack 3A, 3B (FIG. 3), 3C, 3D (FIG. 3), 3E, 3F (FIG. 3), 3G, 3H (FIG. 3).

Moreover, a secondary semi-reflecting quarterwave DBR mirror-stack assembly, as shown in prior-art VCSEL design 11 (FIGS. 1, 2, and 3), is composed of alternating layers of (Al2O3) "Aluminum-Oxide" 11A (FIG. 3) and (ZnO) "Zinc-Oxide" 11B (FIG. 3); thereby, making a mirror pair or one pair of (Al2O3/ZnO) mirror-stacks, or more precisely these two alternating refractive material layers completes one "mirror-pair".

Moreover, if additional mirror pairs are required, several more layers can be epitaxially deposited upon the top outermost surface of the last existing mirror pair's topmost layer producing therein, additional mirror pairs, while the preferred number of mirror pairs will range from five to ten mirror pairs per mirror-stack assembly 11A, 11B (FIG. 3), 11C, 11D (FIG. 3), 11E. 11F (FIG. 3), 11G, 11H (FIG. 3), 11I, 12 (FIG. 3), Furthermore, it should be understood that the thickness and doping level of each layer within prior-art VCSELs is precisely controlled. Any deviation from the designed parameters no matter how slight will effect a VCSEL's performance (i,e., frequency range, flux intensity). For example, a prior-art VCSEL device, if designed to emit laser-light at a wavelength of "200" nanometers, would need to have the thickness of each epitaxially deposited layer of the refractive opposed material used to construct the device's secondary DBR mirror-stack assembly 11 (FIGS. 1, 2, and 3) to be "50" nanometers or one-quarter of one wavelength of the VCSEL's output emissions 12 (FIGS. 1, 2, and 3)

Furthermore, the doping of currently used prior-art VCSEL devices is accomplished by the addition of various dopant materials (e.g., n-type dopants and p-type dopants) to the epitaxial materials that are used for the VCSEL's epitaxial deposition. Currently, prior-art VCSEL devices use many different dopant concentrations of specific dopant materials within the different extrinsic semiconductor layers that make up their structures.

For example, the multiple layers that comprise a prior-art VCSEL's primary quarterwave DBR mirror-stack assembly 3 (FIGS. 1, 2, and 3) could be made n-type conductive when doped with "Selenium" or "Silicon" in a concentration ranging from "1E15" to "1E20" cubic-centimeters, with a preferred range from "1E17" to "1E19" cubic centimeters, while a nominal concentration range would be from "5E17" to "5E18" cubic centimeters 3 (FIGS. 1, 2, and 3).

Furthermore, the percentage of composition in a prior-art VCSEL's primary quarterwave DBR mirror-stack assembly 3 (FIGS. 1, 2, and 3) can be stated as (AlxGaxN/GaN), where x is the variable of "0.05" to "0.96", while in a preferred embodiment x being greater than "0.8". Once the plurality of alternated refractive material layers used in constructing a primary quarterwave DBR mirror-stack assembly 3 (FIGS. 1, 2, and 3) has been deposited upon the top outermost surface of a VCSEL's buffer layer 2 (FIGS. 1, 2, and 3), then can a first contact-layer 4 (FIGS. 1, 2, and 3), constructed from a highly n+ doped (GaN) "Gallium-Nitride" material be epitaxially grown upon the top outermost surface of the last deposited layer of the primary quarter-wave DBR mirror-stack assembly 3 (FIGS. 1, 2, and 3).

Moreover, as shown by prior-art, a VCSEL's first contact layer 4 (FIGS. 1, 2, and 3) provides connectivity to the VCSEL's n-metal contact 5 (FIGS. 1, 2, and 3), but also enhances the reliability of the VCSEL's design by preventing the migration of carrier-dislocations and the like to the VCSEL's active-region.

In addition, to prevent the overcrowding and confusion of illustrating the multiple cladding-layers typical of prior-art VCSEL designs 7 (FIGS. 1, 2, and 3), each cladding-layer is illustrated as a single layer 7A, 7C (FIG. 3). It should be understood that each cladding-layer could be made of more than one layer, where each additional cladding-layer is epitaxially deposited onto a previously deposited cladding-layer. Each cladding-layer 7A, 7C (FIG. 3) is composed from any suitable doped or un-doped material such as N-doped or P-doped (AlGaN) "Aluminum-Gallium-Nitride" ternary semiconductor material.

In addition, a prior-art VCSEL's active-area 7B (FIG. 3) is represented here by a single layer or "Single Quantum Well" (SQW), which is epitaxially deposited upon the top and outermost surface of the previously deposited cladding-layer 7A (FIG. 3). For example, a prior-art VCSEL's active-area 7B (FIG. 38) could be constructed from p-doped (InGaN) "Indium-Gallium-Nitride" extrinsic ternary semiconductor material. It should be understood that currently used prior-art VCSEL's could have an active-area 7B (FIG. 3) comprised as an "Multiple Quantum Well" (MQW), which would include one or more quantum well cladding-barriers and quantum-wells, in particular a first quantum-well cladding-barrier and a second quantum-well cladding-barrier with a quantum-well positioned between the first barrier layer and the second barrier layer.

In addition, a second contact-layer 8 (FIGS. 1, 2, and 3), which is constructed from a highly p+doped (GaN) "Gallium-Nitride" extrinsic binary material, and epitaxially grown upon the top outermost surface of a prior-art VCSEL's second cladding-layer 7C (FIG. 3). The second contact-layer provides positive connectivity to prior-art VCSELs p-metal contact 9 (FIGS. 1, 2, and 3).

In addition, currently used prior-art VCSEL configurations also use a secondary quarterwave DBR mirror-stack assembly, which is comprised as a plurality of epitaxially deposited quarterwave plates that were alternately constructed using materials having opposed refractive indices 11, 12 (FIGS. 1, 2, and 3).

Moreover, the plurality of alternating layers 11A, 11B, 11C, 11D, 11E, 11F, 11G, 11H, 11I, 12 (FIG. 3) include one or more layers of (Al2O3) "Aluminum-Oxide" material, illustrated as layers 11A, 11C, 11E, 11G, 11I (FIG. 3), and one or more layers of (ZnO) "Zinc-Oxide" material, illustrated as layers 11B, 11D, 11F, 11H, 12 (FIG. 3). For example, a layer of (Al2O3) "Aluminum-Oxide" is epitaxially deposited upon the top outermost surface of a prior-art VCSEL's second contact-layer 8 (FIGS. 1, 2, and 3), while a layer of (ZnO) "Zinc-Oxide" is subsequently and epitaxially deposited upon the top outermost surface of the previously deposited (Al2O3) "Aluminum-Oxide" layer; thereby, making a mirror pair of (Al2O3/ZnO) reflectors. If additional mirror-pairs are required, several more layers, which are used to make-up additional mirror-pairs, can be deposited onto the existing and alternated layers of (Al2O3) "Aluminum Oxide" and (ZnO) "Zinc Oxide", It should be understood that a prior-art VCSEL's secondary quarterwave DBR mirror-stack assembly 11, 12 (FIGS. 1, 2, and 3) serves as the prior-art VCSEL's second mirror-stack reflector.

Moreover, the plurality of alternating mirror pairs that make-up a prior-art VCSEL's secondary quarterwave DBR mirror-stack assembly 11, 12 (FIGS. 1, 2, and 3) are formed from one mirror pair to ten mirror pairs, with a preferred number of mirror pairs ranging from four to five mirror pairs. It should be understood that the number of mirror pairs can and should be adjusted for wavelength specific applications.

In addition, a prior-art VCSEL will have a p-metal electrical contact 9, 10 (FIGS. 1, 2, and 3), which is formed upon the prior-art VCSEL's second contact-layer 8 (FIGS. 1, 2, and 3) by disposing any suitable conductive material such as Indium-Tin-Oxide, Gold, Zinc, Platinum, Tungsten, or Germanium like metallic alloys upon the top outermost surface of a prior-art VCSEL's second contact-layer 8 (FIGS. 1, 2, and 3).

In addition, a prior-art VCSEL will have a n-metal electrical contact 5, 6 (FIGS. 1, 2, and 3), which is formed upon the prior-art VCSEL's first contact-layer 4 (FIGS. 1, 2, and 3) by disposing any suitable conductive material such as Indium-Tin-Oxide, Gold, Zinc, Platinum, Tungsten, or Germanium like metallic alloys upon the top outermost surface of a prior-art VCSEL's first contact layer 4 (FIGS. 1, 2, and 3). It should be understood that depending upon which material is selected for a prior-art VCSEL's electrical contacts 5, 6, 9, 10 (FIGS. 1, 2, and 3) a specific method of disposition, disposing, and patterning onto the first and second contact layers 4, 8 (FIGS. 1, 2, and 3) for any specific material will change, along with that material's electrical contacts 5, 6, 9, 10 (FIGS. 1, 2, and 3).

In addition, is a summation of the order of layered deposition used in the construction of prior-art double-heterostructure VCSEL devices, as illustrated by FIGS. 1, 2, and 3. Starting first with the base-substrate back-reflecting mirror structure 1 (FIGS. 1, 2, and 3). Next, a multi-layered buffer region constructed from (AlN) "Aluminum-Nitride" material 2 (FIGS. 1, 2, and 3) is deposited upon a prior-art VCSEL's substrate, Next, is a primary quarterwave DBR mirror-stack assembly 3 (FIGS. 1, 2, and 3), which is deposited onto the top outermost surface of the last deposited layer of (AlN) "Aluminum-Nitride" 2 (FIGS. 1, 2, and 3). Next, in the order of layered deposition is a first contact-layer 4 (FIGS. 1, 2, and 3), which is deposited upon the top outermost surface of the last deposited layer used to comprise a primary quarterwave DBR mirror-stack assembly 3 (FIGS. 1, 2, and 3). Next, is a prior-art VCSEL's first cladding-region 7A (FIG. 3), which is followed by the prior-art VCSEL's active-area layer 7B (FIG. 3), which is followed by the prior-art VCSEL's second cladding-layer 7C (FIG. 3), which is followed by the prior-art VCSEL's second contact-layer 8 (FIGS. 1, 2, and 3). Next, and final in the order of layered deposition, is a prior-art VCSEL's semi-reflecting secondary quarterwave DBR mirror-stack assembly 11 (FIGS. 1, 2, and 3), which is deposited upon the top outmost surface of the prior-art VCSEL's second contact-layer 8 (FIGS. 1, 2, and 3).

Moreover, it should be noted that a prior-art VCSEL's second contact-layer 8 (FIGS. 1, 2, and 3), second cladding-layer 7C (FIG. 3), active-area 7B (FIG. 3), and first cladding-layer 7A (FIG. 3) are altogether, mesa-etched layers having diameters substantially larger than the prior-art VCSEL's top outermost emitter-layer 12 (FIGS. 1, 2, and 3) and the prior-art VCSEL's secondary mirror-stack assembly that define the prior-art VCSEL's principal shape (FIGS. 1, 2, and 3). Additionally, so that a prior-art VCSEL's active-area 7B (FIG. 3) is not damaged by the etching process, proton implantation can be utilized therein for current isolation, where the implantation mask is slightly larger than the prior-art VCSEL's emitter-aperture 12 (FIGS. 1, 2, and 3).

In addition, after the above described etching and implantation steps are completed a p-metal contact 9, 10 (FIGS. 1, 2, and 3) is deposited next upon the top outermost surface of a prior-art VCSEL's second contact-layer 8 (FIGS. 1, 2, and 3), while leaving the prior-art VCSEL's emitter area open 12 (FIGS. 1, 2, and 3). The n-metal contact is next epitaxially deposited upon the top outermost surface of a prior-art VCSEL's first contact-layer 5, 6 (FIGS. 1, 2, and 3). Additionally, the metallic base-substrate back-reflecting mirror structure 1 (FIGS. 1, 2, and 3), when used in conjunction with a (AlGaN/GaN) "Aluminum-Gallium-Nitride/Gallium-Nitride" based primary quarterwave DBR mirror-stack assembly will provide approximately 99% of the prior-art VCSEL's reflectivity.

Figure 4:
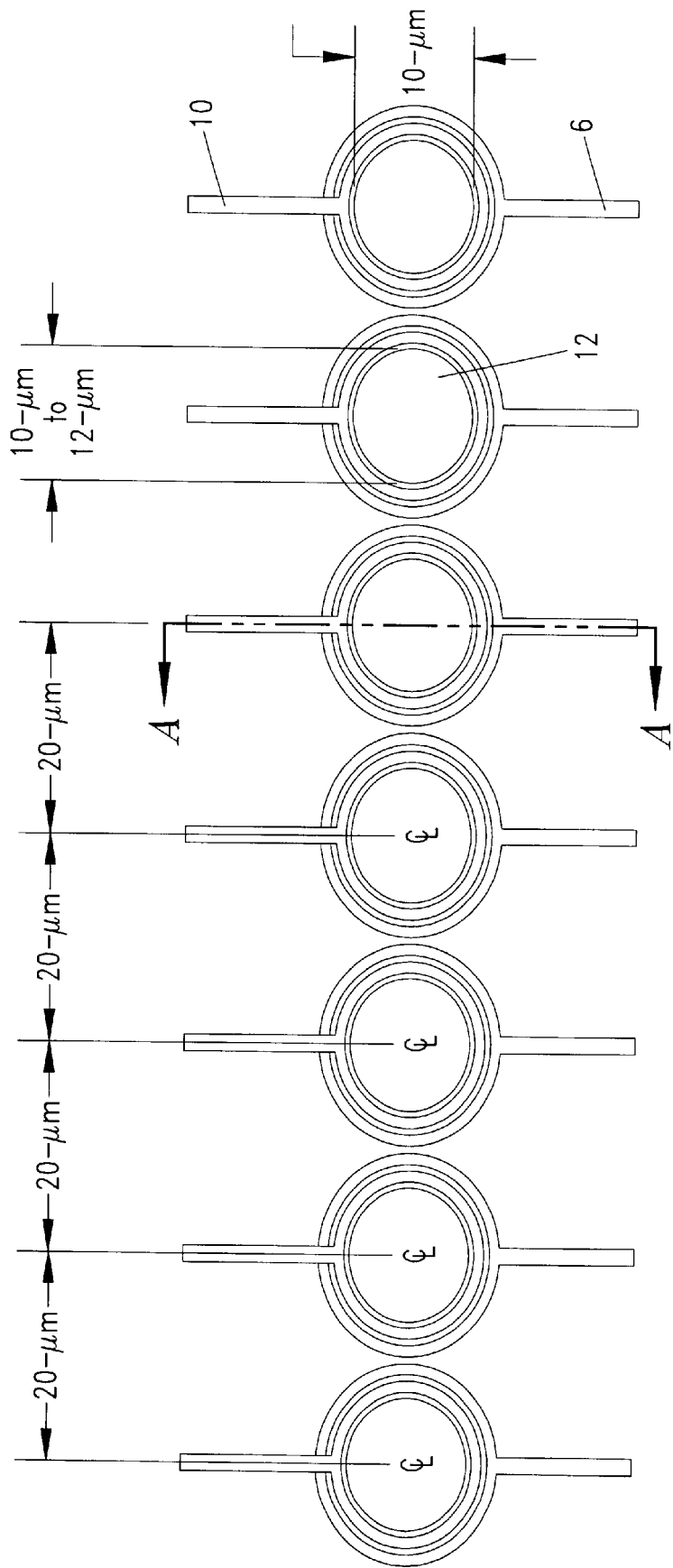
FIG. 4 is an orthographic plan-view drawing of a linear array of seven mesa-etched VCSELs, illustrating emitter diameter, layout spacing, and centerline dimensions, shown as prior-art.
Figure 6:
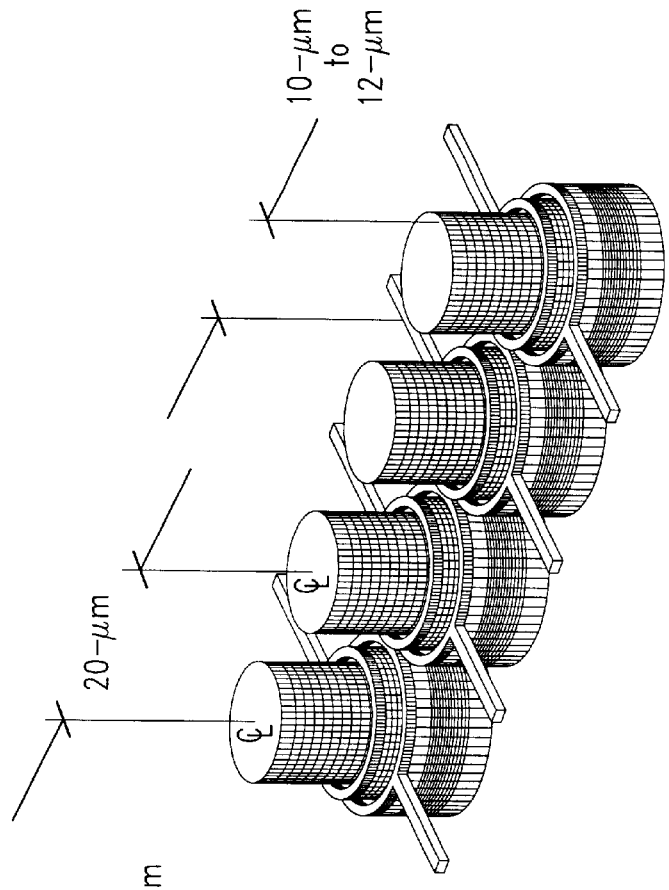
FIG. 6 is a "30" degree 3D isometric top-left side-view drawing of four mesa-etched VCSELs, illustrating an alternate elliptical shapes and centerline-to-centerline dimensions, shown as prior-art.
Figure 5:
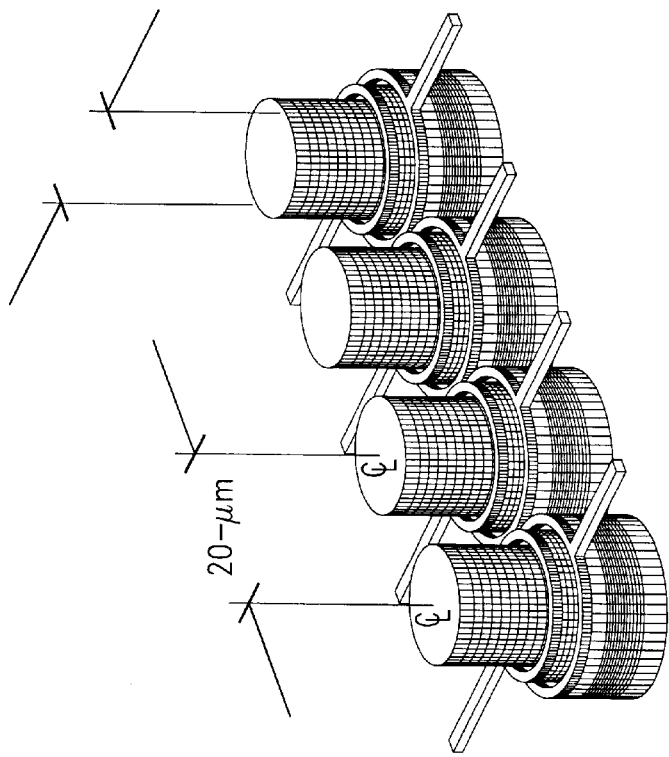
FIG. 5 is a "30" degree 3D isometric top-right side-view drawing of four mesa-etched VCSELs, illustrating emitter diameter and centerline-to-centerline dimensions, shown as prior-art.

In addition, as illustrated FIGS. 4, 5, and 6, prior-art teaches that VCSEL laser devices can be used in two dimensional linear or row-and-column laser-arrays, where they might have a centerline-to-centerline dimension of approximately "20" micrometers, as illustrated in FIGS. 4, 5, and 6, while the prior-art VCSEL's emission apertures 12 (FIGS. 1, 2, and 3) might have a circular diameter of "10" micrometers, or as an alternative embodiment might have an elliptical shaped diameter of "10"x"12" micrometers.

The preferred embodiment for a (PCVCSEL) "Phase Conjugated Vertical Cavity Surface Emitting Laser" is illustrated for the first time in FIGS. 7 and 8 as 3D isometric-view drawings.

Moreover, FIGS. 7 and 8 display a PCVCSEL's various extrinsic semiconductor layers, which are clearly illustrated and each numbered with their own figures number. The PCVCSEL design also uses (e-h) "electron/hole" recombination radiation to produce laser emissions.

Figure 9:
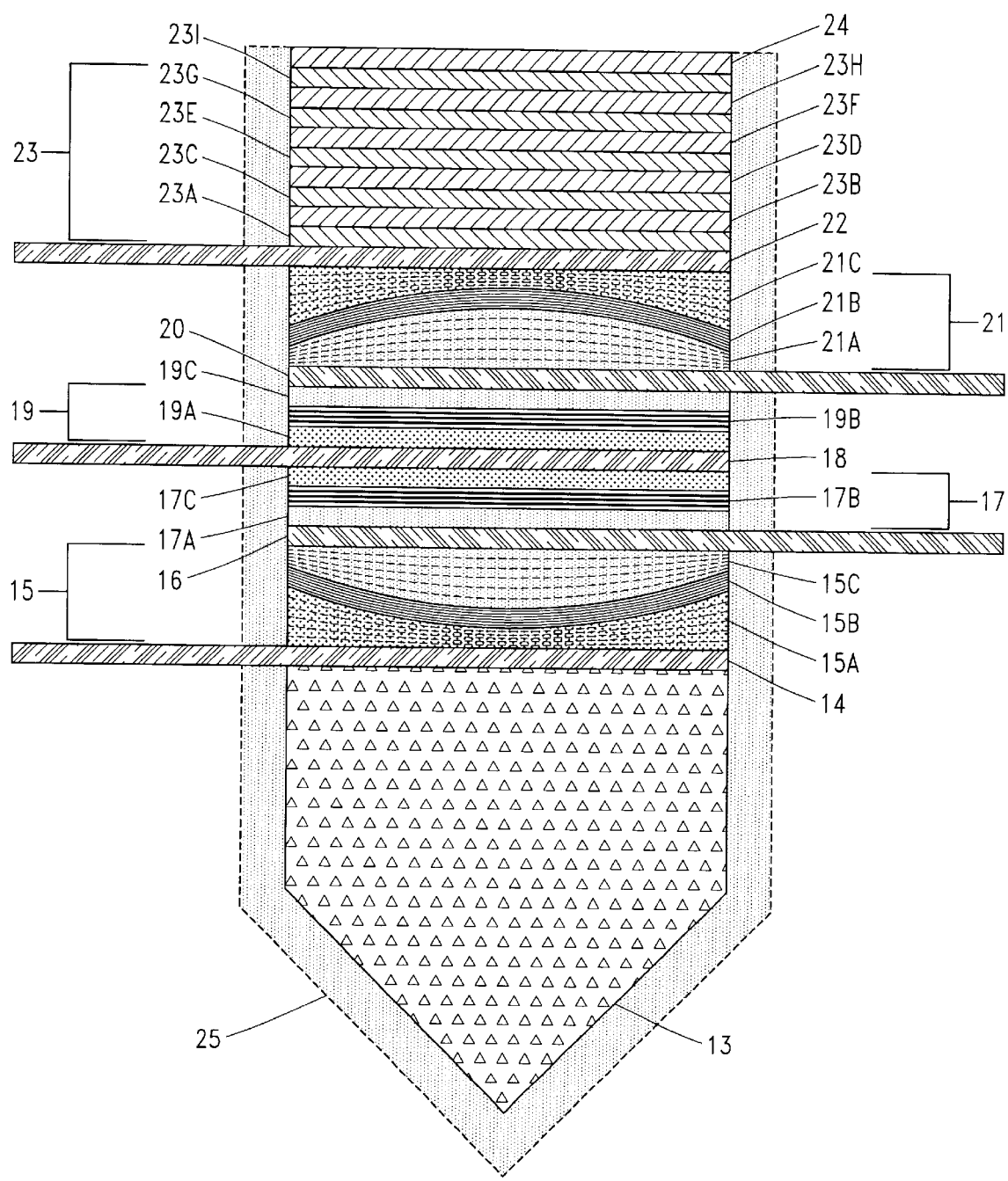
FIG. 9 is an orthographic side-view section "B—B" drawing of a mesaetched PCVCSEL, illustrated as having four MQW active-regions, one plane-parallel mirror-stack assembly, and one internal reflecting corner-cube prism waveguide, displaying the PCVCSEL's multi-layered configuration.

Furthermore, as illustrated in FIG. 9, a complete PCVCSEL device has many different extrinsic semiconductor layers that make-up its structure. These various extrinsic semiconductor layers mostly comprise a PCVCSEL's four double-heterostructure active-regions, and are built-up and deposited one upon the other using MBE or MOVPE manufacturing methods and procedures.

The PCVCSEL devices, as presented here, however, will not be constructed using a back-reflecting metallic-alloy base-supporting substrate 1 (FIGS. 1, 2. and 3), like those taught by prior-art VCSEL devices, but remains a viable alternative to the presented and preferred embodiment. Nevertheless, in order to create a stable resonator within a PCVCSEL's vertical-cavity a bottom base-reflector of some kind is still required or the amplification of stimulated light emissions will not occur.

Therefore, within this preferred embodiment is a base-mirror reflector, which is made from a material having an absolute lattice mismatch to all semiconductor materials and can be formed into a single geometric structure whose shape is conducive to total internal reflection of all intracavity laser-spectra, giving it an effective reflective power greater than the "99.9" percent ratings of current prior-art quarterwave mirror-stack reflectors.

Figure 16:
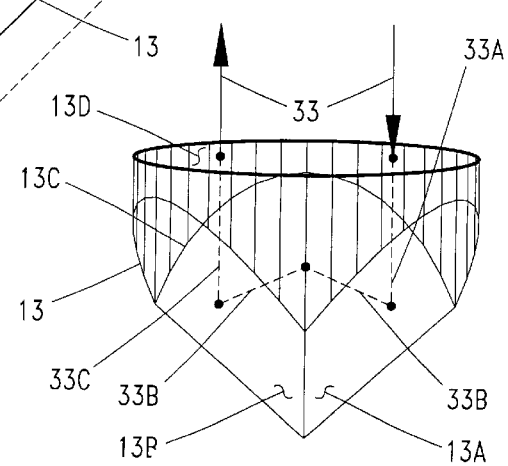
FIG. 16 is a "30" degree 3D isometric top front-view drawing of a PCVCSEL's internal reflecting corner-cube prism waveguide, which also illustrates the corner-cube prism waveguide's process of internal light retro-reflection using a ray-trace diagram.

In addition, as illustrated in FIG. 16, is a totally internal reflecting corner-cube prism waveguide, which reflects a "100" percent all optical radiation that enters the normal front-face surface of the corner-cube prism waveguide. The previously mentioned normal front-face surface is perpendicular to the intracavity generated light that propagates through the PCVCSEL, but is plane-parallel to the layers that makeup the PCVCSEL's two planar shaped double-heterostructure diodes and one quarterwave mirror-stack assembly.

Moreover, a PCVCSEL's corner-cube prism waveguide can be constructed from (SiO2) "Fused Silica", which will allow the waveguide to freely transmit and internally reflect all incident optical radiation having wavelengths ranging from vacuum-ultraviolet (i.e., with a wavelength of "150" nanometers) to wavelengths reaching down into the infrared range (i.e., with a wavelength of "1.55" micrometers).

In addition, an internally reflecting corner-cube prism waveguide will have reflecting powers of a "100" percent if composed of (SiO2) "Fused Silica" or some other appropriate optical material, and can reflect internally any visible wavelength of optical radiation that enters the top and horizontal front-face surface of the corner-cube prism waveguide.

Figure 17:
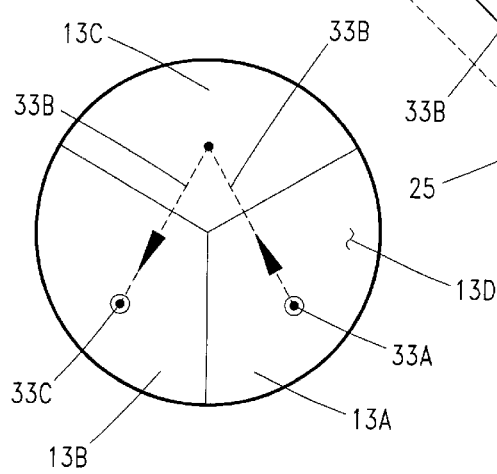
FIG. 17 is an orthographic plan-view drawing of a PCVCSEL's internal retro-reflecting corner-cube prism waveguide, illustrating the corner-cube prism waveguide's process of internal light retro-reflection using a planviewed ray-trace diagram.

Furthermore, as illustrated in FIG. 16 (i.e., a 3D isometric-view drawing of the corner-cube prism waveguide showing an isometric-view of a ray-traced pathway for incoming and outgoing optical radiation), and in FIG. 17 (i,e., a 3D orthographic plan-view of the corner-cube prism waveguide showing an orthographic plan-view of a ray-traced pathway for incoming and outgoing optical radiation) is a PCVCSEL's corner-cube prism waveguide.

Moreover, the main function of FIGS. 16 and 17 is to describe, through the use of two simple diagrams, how light-rays, after entering the top and horizontal front-face surface of a corner-cube prism waveguide are internally reflected "180" degrees backwards toward their originating light-source. Furthermore, a detailed explanation of this totally internal reflection process, which happens within a PCVCSEL's corner-cube prism waveguide, is presented toward the end of the invention's preferred embodiment.

In addition, a primary quarterwave DBR mirror-stack assembly, which is known and normally taught by prior-art VCSEL design, has been replaced by a PCVCSEL's corner-cube prism waveguide 13 (FIGS. 7, 8, 9, 11, 12, 15, 16, and 17). Moreover, a PCVCSEL's corner-cube prism waveguide is exactly what its name implies, a prism waveguide having the shape of a cube's corner, which is cut off orthogonal to one of its triad (i.e., body-diagonal) axes, while the resultant prism's horizontal front-face is typically formed into a circular flat surface.

Moreover, the resulting waveguide structure has three prism facets, which produce three totally internal reflections that will reflect any incident light-ray backwards a "180" degrees into its originating direction, no matter what the previously mentioned light-ray's angle of incidence was upon the normal surface of the waveguide.

Therefore, a light-ray reflected by a corner-cube waveguide is shifted laterally by an amount that depends upon the light-ray's angle of incidence and point of entry onto the normal horizontal front-face surface of a PCVCSEL's corner-cube prism waveguide. The location of a corner-cube prism waveguide is at the base of each PCVCSEL's vertical-cavity replacing therein, the quarterwave "Distributed Bragg Reflector" (DBR) mirror-stack assembly normally used in prior-art VCSEL designs.

Furthermore, unlike the quarter-wave mirror-stack assemblies currently used in prior-art VCSEL designs, which are composed of alternating plane-parallel quarterwave plates, a PCVCSEL's corner-cube prism waveguide is monostructural (i.e., formed into a single shape from a single material). Moreover, (SiO2) "Fused Silica" is the material of choice in constructing a corner-cube prism waveguide, not only because it is inexpensive, moisture and heat resistant, and easy to use in the construction of micro-optics, but because it is also amorphous (i.e., having no distinct crystalline structure) and therefore, has an absolute lattice-mismatch to (GaAs) "Gallium-Arsenide" and/or (AlGaAs) "Aluminum-Gallium-Arsenide, and several other semiconductors, as well.

In addition, a corner-cube prism waveguide, when constructed from (SiO2) "Fused Silica" is transparent to all optical radiation with wavelengths ranging from the "150" nanometers of vacuum-ultraviolet optical radiation to the "1.55" micrometers of infrared optical radiation and therefore, can be used with any type of diode material presently available. Moreover, remembering that it is a corner-cube prism waveguide's geometric structure 13 (FIGS. 7, 8, 9, 11, 12, 15, 16, and 17) that gives it the ability to reflect internally all optical radiation that enters its normal horizontal front-face surface.

In addition, it should be understood that within each PCVCSEL device the thickness and doping levels are precisely controlled in every layer. Any deviation from the designed parameters no matter how slight will effect the PCVCSEL's performance (i.e., frequency range, flux intensity). For example, if a PCVCSEL device were designed to emit laser-light at a wavelength of "200" nanometers then the thickness of each layer used in a PCVCSEL's quarterwave DBR mirror-stack assembly 24 (FIGS. 7, 8, and 9) would need to be "50" nanometers or one-quarter of one wavelength of the PCVCSEL's laser output emission.

In-general, each distributed layer used in a PCVCSEL's mirror-stack assembly 23 (FIGS. 7, 8, and 9), more specifically the PCVCSEL's top quarterwave DBR mirror-stack assembly 24 (FIGS. 7, 8, and 9), must have an optical thickness equaling one-quarter of one wavelength of the PCVCSEL's emitted optical radiation.

Furthermore, the doping of a PCVCSEL device is accomplished by the addition of various dopant materials (e.g., n-type dopants and p-type dopants) to epitaxial materials during their epitaxial deposition. Typically, a PCVCSEL device will use many different dopant concentrations of specific dopant materials within the different extrinsic semiconductor materials that make-up the PCVCSEL's various structures. Typically, a first structure deposited within a PCVCSEL device would be its first contact-layer. Next, in line for deposition would be a PCVCSEL's totally internal reflecting cornercube prism waveguide, which is constructed from (SiO2) "Fused Silica" and deposited upon the top outermost surface of a single extrinsic semiconductor substrate (i.e., which is also a PCVCSEL's first contact-layer) is accomplished using MBE, MOVPE, or sputtered deposition manufacturing methods and procedures. The distribution of (SiO2) "Fused Silica" is accomplished by a sputtered depositing of (SiO2) "Fused Silica" into a previously etched-out hole(s), which has the same dimensions, structure, and shape as a vertically positioned PCVCSEL's corner-cube prism waveguide, The distribution of (SiO2) "Fused Silica" into a previously etched-out and shaped hole(s) will ultimately give us the base-structure(s) on which to build a PCVCSEL device or multiple PCVCSEL devices, In addition, it should be understood that the process of intracavity phase-conjugation and its distortion removing properties can be created using any wavelength of optical radiation, which shows that the process of four-wave mixing phase-conjugation is independent of any one wavelength of optical radiation. The process of phase-conjugation itself must therefore also be independent of any one wavelength determined extrinsic semiconductor material as well, Therefore, the choice between an extrinsic semiconductor or other material used in a PCVCSEL's construction are presented below as only working examples to demonstrate that the PCVCSEL's design has sufficient novelty.

In addition, is a PCVCSEL's first contact-layer 14 (FIGS. 7, 8, 9, and 18), which is composed of a highly p+ doped (GaAs) "Gallium-Arsenide" binary material, and also acts as the PCVCSEL's substrate and is located at the top of the corner-cube prism waveguide's normal horizontal and circular front-face surface 13D (FIGS. 16 and 17).

Moreover, a PCVCSEL's first contact-layer 14 (FIGS. 7, 8, 9, and 18), while providing positive electrical connectivity to the PCVCSEL's first active-region 15 (FIGS. 8, 9, and 18), also enhances the reliability of the PCVCSEL's design by preventing the migration of carrier-dislocations and the like to the PCVCSEL's first active-region 15 (FIGS. 8, 9, and 18).

In addition, is a PCVCSEL's first cladding-layer 15A (FIGS. 8, 9, 18, and 18C), which has a flat planar shaped bottom surface and a convex shaped top surface, and is positioned to contain the PCVCSEL's first active-area (i.e., called Pump 1) 15B (FIGS. 8, 9, 18, and 18A). Additionally, a PCVCSEL's first cladding-layer is constructed from a concentrically-graded P-doped (GaAlAs) "Gallium-Aluminum-Arsenide" ternary material ISA (FIGS. 8, 9, 18, and 18C); wherein, the ternary material's concentration of "Gallium" gradient will, starting from the first cladding-layer's bottom-edge. begin to gradually increase upward toward the PCVCSEL's first active-area (i.e., called Pump 1). For example, the amount of "Gallium" gradient will begin to gradually increase from $Ga_{0.55}Al_{0.45}As$ 38A (FIG. 18C) to $Ga_{0.6}Al_{0.4}As$ 38B (FIG. 18C), to $Ga_{0.65}Al_{0.35}As$ 38C (FIG. 18C), to $Ga_{0.7}Al_{0.3}As$ 38D (FIG. 18C), to $Ga_{0.75}Al_{0.25}As$ 38E (FIG. 8,C), and finally to $Ga_{0.8}Al_{0.2}As$ 38F (FIG. 18C).

Additionally, a ternary material's concentration of "Aluminum" gradient will, starting from the first cladding-layer's bottom-edge, begin to gradually decrease upward toward the PCVCSEL's first active-area (i.e., called Pump 1). For example the amount of "Aluminum" gradient will begin to gradually decrease from $Ga_{0.55}Al0.45As$ 38A (FIG. 18C) to $Ga_{0.6}Al_{0.4}As$ 38B (FIG. 18C), to $Ga_{0.65}Al_{0.35}As$ 35C (FIG. 18C), to $Ga_{0.7}Al_{0.3}As$ 38D (FIG. 18C), to $Ga_{0.75}Al_{0.25}As$ 38E (FIG. 18C), and finally to $Ga_{0.8}Al_{0.2}As$ 38F (FIG. 18C). Furthermore, a first cladding-layer's dotted gradient boundary-lines 39A, 39B, 39C, 39D, 39E (FIG. 18C) illustrate how the graded amounts of "Gallium" and "Aluminum" materials present in a PCVCSEL's first cladding-layer are smoothly, proportionally, and evenly distributed across the first cladding-layer's vertical thickness.

In addition, the ternary material's concentration of "Gallium" gradient will gradually increase from a first cladding-layer's thicker outer-perimeter inward toward the vertical-cavity's c-axis, where a PCVCSEL's first cladding-layer is optically thinner (i.e., having a lower refractive index). Moreover, the process of increasing the amounts of "Gallium" over "Aluminum" will equalize the optical refractive index across the first cladding-layer's whole horizontal-area.

In addition, is a PCVCSEL device designed to use four active-areas 15B, 17B, 19B, 21B (FIGS. 8, 9, 18, 18A, 19, 19C, 20, 20A, 21, and 21A); wherein, each of the four active-areas are located within its own active-region. Furthermore, a PCVCSEL's first active-area comprises, either a convex shaped SQW constructed from (GaAs) "Gallium-Arsenide", or a convex shaped MQW 15B (FIGS. 8, 9, 18, and 18A) having six quantum wells constructed from (GaAs) "Gallium-Arsenide" 35A, 35B, 35C, 35D, 35E, 35F (FIG. 18A) and seven quantum well cladding-layers constructed from (GaAlAs) "Gallium-Aluminum-Arsenide" 34A, 34B, 34C, 34D, 34E, 34F, 34G (FIG. 18A). Nevertheless, whatever structure is finally used as a PCVCSEL's first active-area the layers used to make up the PCVCSEL's first active-area should equal an optical thickness that is one quarter of one wavelength of the PCVCSEL's laser output emission.

For example, if a PCVCSEL device were designed to emit a wavelength of "800" nanometers, its first active-area's total optical thickness would need to be one-quarter of "800" nanometers to properly function. Therefore, a first active-area's total optical thickness would need to be "200" nanometers thick. Because a PCVCSEL's first active-area is made-up of multiple quantum wells and multiple quantum well cladding-layers the optical thicknesses of each of these different layers, when added together, should equal the required total optical thickness previously calculated.

Moreover, a PCVCSEL's first active-area will have six quantum wells constructed from (GaAs) "Gallium-Arsenide" 35A, 35B, 35C, 35D, 35E, 35F (FIG. 18A); wherein, each quantum well will have an optical thickness of "10" nanometers. Additionally, a PCVCSEL's first active-area will also have seven quantum well cladding-layers constructed from (GaAlAs) "Gallium-Aluminum-Arsenide" 34A, 34B, 34C, 34D, 34E, 34F, 34G (FIG. 18A): wherein, each quantum well cladding-layer will have an optical thickness of "20" nanometers. The combined thicknesses of the six quantum wells and the seven quantum well cladding-layers equal "200" nanometers or one-quarter of one wavelength of a PCVCSEL's "800" nanometer laser output emissions.

In addition, is a PCVCSEL's second cladding-layer 15C (FIGS. 8, 9, 18. and 18B), which has convex shaped bottom surface and a flat planar shaped top surface, and is positioned to contain the PCVCSEL's first active-area (i.e., called Pump 1) 15B (FIGS. 8, 9, 18, and 18A). Additionally, a PCVCSEL's second cladding-layer is constructed from a concentrically-graded N-doped (GaAlAs) "Gallium-Aluminum-Arsenide" ternary material 15C (FIGS. 8, 9, 18, and 18A); wherein, a ternary material's concentration of "Gallium" gradient will, starting from the second cladding-layer's top-edge, begin to gradually increase downward toward a PCVCSEL's first active-area (i.e., called Pump 1). For example, the amount of "Gallium" gradient will begin to gradually increase from $Ga_{0.55}Al_{0.45}As$ 36F (FIG. 18B) to $Ga_{0.6}Al_{0.4}As$ 36E (FIG. 18B), to $Ga_{0.65}Al_{0.35}As$ 36D (FIG. 18B), to $Ga_{0.7}Al_{0.3}As$ 36C (FIG. 18B), to $Ga_{0.75}Al_{0.25}As$ 36B (FIG. 18B), and finally to $Ga_{0.8}Al_{0.2}As$ 36A (FIG. 18B).

Additionally, a ternary material's concentration of "Aluminum" gradient will, starting from the second cladding-layer's top-edge, begin to gradually decrease downward toward a PCVCSEL's first active-area (i.e, called Pump 1). For example, the amount of "Aluminum" gradient will begin to gradually decrease from $Ga_{0.55}Al_{0.45}As$ 36F (FIG. 18B) to $Ga_{0.6}Al_{0.4}As$ 36E (FIG. 18B), to $Ga_{0.65}Al_{0.35}As$ 36D (FIG. 18B), to $Ga_{0.7}Al_{0.3}As$ 36C (FIG. 18B), to $Ga_{0.75}Al_{0.25}As$ 36B (FIG. 18B), and finally to $Ga_{0.8}Al_{0.2}As$ 36A (FIG. 18B).

Furthermore, a second cladding-layer's dotted gradient boundary-lines 37E, 37D, 37C, 37B, 37A (FIG. 18B) illustrate that the graded amounts of "Gallium" and "Aluminum" materials present in a PCVCSEL's second cladding-layer are smoothly, proportionally, and evenly distributed across the second cladding-layer's vertical thickness.

Additionally, a ternary material's concentration of "Gallium" gradient will gradually increase from a second cladding-layer's thicker outer-perimeter inward toward the vertical-cavity's c-axis, where a PCVCSEL's second cladding-layer is optically thinner (i.e., having a lower refractive index). Moreover, the process of increasing the amounts of "Gallium" over "Aluminum" gradient will equalize the refractive index across the second cladding-layer's whole horizontal-area.

In addition, is a PCVCSEL's second contact-layer 16 (FIGS. 7, 8, 9, and 18), which is constructed from a highly n+ doped (GaAs) "Gallium-Arsenide" binary material, and epitaxially grown upon the top outermost surface of a PCVCSEL's second cladding-layer 15C (FIGS. 8, 9, 18, and 18B), giving the second contact-layer a position between the PCVCSEL's first and second active-regions. Moreover, a second contact-layer 16 (FIGS. 7, 8, 9, and 18), while providing negative electrical connectivity to a PCVCSEL's first and second active-regions 15 (FIGS. 8, 9, and 18), also enhances the reliability of the PCVCSEL design by preventing the migration of carrier-dislocations and the like to the PCVCSEL's first and second active-regions 15 (FIGS. 8, 9, and 18).

In addition, is a PCVCSEL's third cladding-layer 17A (FIGS. 8, 9, and 20), which has a flat planar shaped bottom surface and a flat planar shaped top surface. Additionally, a PCVCSEL's third cladding-layer is constructed from N-doped (GaAlAs) "Gallium-Aluminum-Arsenide" ternary material, and is positioned to contain the PCVCSEL's second active-area (i.e., called Probe 1) 17B (FIGS. 8, 9, 20, and 20A).

In addition, is a PCVCSEL's second active-area (i.e., called Probe 1), which comprises either a flat planar shaped SQW constructed from (GaAs) "Gallium-Arsenide", or a flat planar shaped MQW 17B (FIGS. 8, 9, 20, and 20A) having three quantum wells constructed from (GaAs) "Gallium-Arsenide" 79A, 79B, 79C (FIG. 20A) and four quantum wall cladding-layers constructed from (GaAlAs) "Gallium-Aluminum-Arsenide" 79A, 78B, 78C, 78D (FIG. 20A). Nevertheless, whatever structure is finally used as a PCVCSEL's second active-area the layers used to make up the PCVCSEL's second active-area should equal an optical thickness that is one quarter of one wavelength of the PCVCSEL's laser output emission.

For example, if a PCVCSEL device were designed to emit a wavelength of "800" nanometers, its second active-area's total optical thickness would need to be one-quarter of "800" nanometers to properly function. Therefore, a second active-area's total optical thickness would need to be "200" nanometers thick, Because a PCVCSEL's second active-area is made-up of multiple quantum wells and multiple quantum well cladding-layers the optical thicknesses of each of these different layers, when added together, should equal the required total optical thickness previously calculated Moreover, a PCVCSEL's second active-area has three quantum wells constructed from (GaAs) "Gallium-Arsenide" 79A, 79B, 79C (FIG. 20A); wherein, each quantum well has an optical thickness of "20" nanometers. Additionally, a PCVCSEL's second active-area has four quantum well cladding-layers constructed from (GaAlAs) "Gallium-Aluminum-Arsenide" 78A, 78B, 78C, 78D (FIG. 20A); wherein, each quantum well cladding-layer has an optical thickness of "35" nanometers. Moreover, the combined thicknesses of the three quantum wells and the four quantum well cladding-layers will equal "200" nanometers or one-quarter of one wavelength of a PCVCSEL's "800" nanometer laser output emissions.

In addition, is a PCVCSEL's fourth cladding-layer 17C (FIGS. 8, 9, and 20), which has a flat planar shaped bottom surface and a flat planar shaped top surface, Additionally, a PCVCSEL's fourth cladding-layer is constructed from P-doped (GaAlAs) "Gallium-Aluminum-Arsenide" ternary material, and is positioned for the PCVCSEL's second active-area (i.e., called Probe 1) 17B (FIGS. 8, 9, 20, and 20A).

In addition, is a PCVCSEL's third contact-layer 18 (FIGS. 7, 8, 9, 20, and 21), which is constructed from a highly p+doped (GaAs) "Gallium-Arsenide" binary material, and epitaxially grown upon the top outermost surface of the PCVCSEL's fourth cladding-layer 17C (FIGS. 9 and 20), giving the third contact-layer a position between the PCVCSEL's second and third active-regions. Moreover, a third contact-layer 18 (FIGS. 7, 8, 9, 20, and 21), while providing positive electrical connectivity to a PCVCSEL's second and third active-regions 17 (FIGS. 7, 8, 9, 20, and 21) also enhances the reliability of the PCVCSEL design by preventing the migration of carrier-dislocations and the like to the PCVCSEL's second and third active-regions 17 (FIGS. 7, 8, 9, 20, and 21), In addition, is a PCVCSEL's fifth cladding-layer 19A (FIGS. 8, 9, and 21), which has a flat planar shaped bottom surface and a flat planar shaped top surface. Additionally, a PCVCSEL's fifth cladding-layer is constructed from a P-doped (GaAlAs) "Gallium-Aluminum-Arsenide" ternary material, and is positioned to contain the PCVCSEL's third active-area (i.e., called Probe 2) 19B (FIGS. 8, 9, 21, and 21A).

Figure 21A:
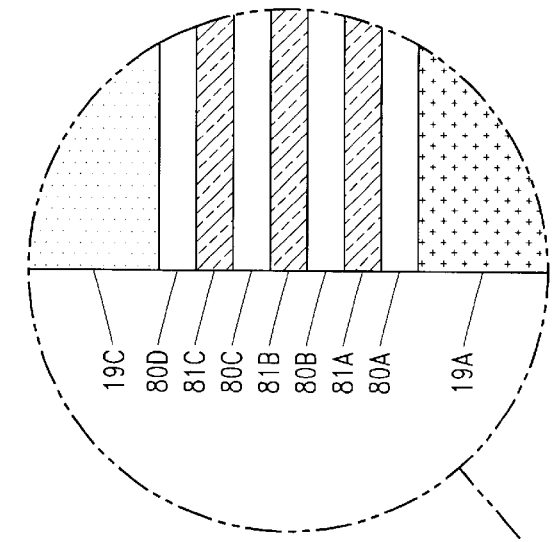
FIG. 21A is auxiliary close-up sectional view drawing of a PCVCSEL's third active-area, displayed edge-on at its circumference.
Figure 21:
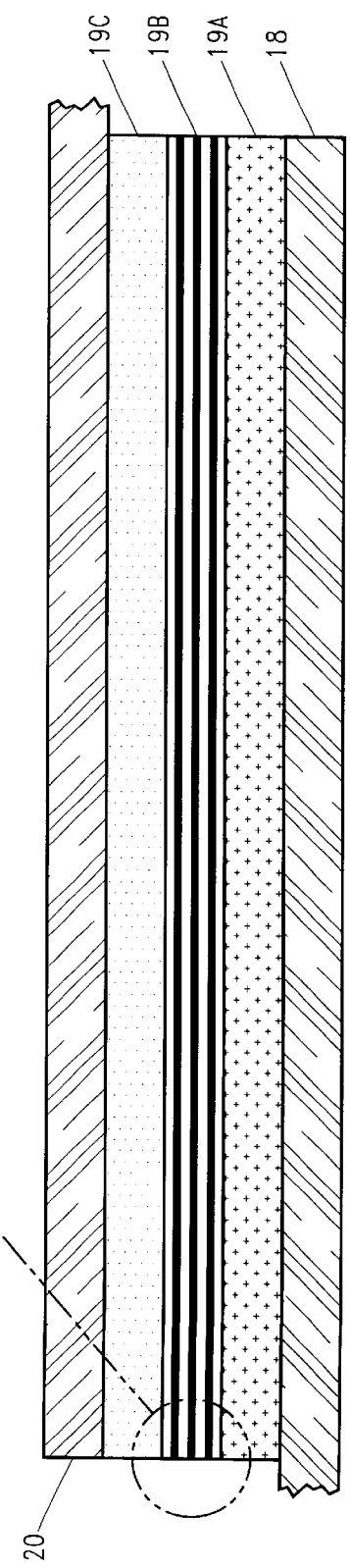
FIG. 21 is a close-up sectional view drawing of a PCVCSEL's third active-region (i.e., called Probe 2).

In addition, is a PCVCSEL's third active-area (i.e., called Probe 2), which will contain either a flat planar shaped SQW constructed from (GaAs) "Gallium-Arsenide", or a flat planar shaped MQW 19B (FIGS. 8, 9, 21, and 21A) having three quantum wells constructed from (GaAs) "Gallium-Arsenide" 81A, 81B, 81C (FIG. 21A) and four quantum well cladding-layers constructed from (GaAlAs) "Gallium-Aluminum-Arsenide" 80A, 80B, 80C, 80D (FIG. 21A). Nevertheless, whatever structure is finally used as a PCVCSEL's third active-area the layers used to make up the PCVCSEL's third active-area should equal an optical thickness that is one quarter of one wavelength of the PCVCSEL's laser output emission.

For example, if a PCVCSEL device were designed to emit a wavelength of "800" nanometers, its third active-area's total optical thickness would need to be one-quarter of "800" nanometers to properly function. Therefore, a third active-area's total optical thickness would need to be "200" nanometers thick. Because a PCVCSEL's third active-area is made-up of multiple quantum wells and multiple quantum well cladding-layers the optical thicknesses of each of these different layers, when added together, should equal the required total optical thickness previously calculated.

Moreover, a PCVCSEL's third active-area has three quantum wells constructed from p+ doped (GaAs) "Gallium-Arsenide" 81A, 81B, 81C (FIG. 21A); wherein, each quantum well will have an optical thickness of "20" nanometers. Additionally, a PCVCSEL's third active-area has four quantum well cladding-layers constructed from P+doped (GaAlAs) "Gallium-Aluminum-Arsenide" 80A, 80B, 80C, 80D (FIG. 21A); wherein, each quantum well cladding-layer will have an optical thickness of "35" nanometers. Moreover, the combined thicknesses of the three quantum wells and the four quantum well cladding-layers will equal "200" nanometers or one-quarter of one wavelength of a PCVCSEL's "800" nanometer laser output emission.

In addition, is a PCVCSEL's sixth cladding-layer 19C (FIGS. 8, 9, and 21), which has a flat planar shaped bottom surface and a flat planar shaped top surface. Additionally, a PCVCSEL's sixth cladding-layer is constructed from a N-doped (GaAlAs) "Gallium-Aluminum-Arsenide" ternary material, and positioned for the PCVCSEL's third active-area (i.e., called Probe 2) 19B (FIGS. 8, 9, 21, and 21A).

In addition, is a PCVCSEL's fourth contact-layer 20 (FIGS. 7, 8, 9, 19, and 21), which is constructed from a highly n+ doped (GaAs) "Gallium-Arsenide" binary material, and epitaxially grown upon the top outermost surface of the PCVCSEL's sixth cladding-layer 19C (FIGS. 9 and 21), giving the fourth contact-layer a position between the PCVCSEL's third and fourth active-regions. Moreover, a fourth contact-layer 20 (FIGS. 7, 8, 9, 19, and 21), while providing negative electrical connectivity to a PCVCSEL's third and fourth active-regions 19, 21 (FIGS. 7, 8, 9, 19, and 21), also enhances the reliability of the PCVCSEL design by preventing the migration of carrier-dislocations and the like to the PCVCSEL's third and fourth active-regions 19, 20 (FIGS. 7, 8, 9, 19, and 21).

In addition, is a PCVCSEL's seventh cladding-layer 21A (FIGS. 8, 9, 19, and 19B), which has a flat planar shaped bottom surface and a concave shaped top surface, and is positioned to contain the PCVCSEL's fourth active-area (i.e., called Pump 2) 21B (FIGS. 8, 9, 19, and 19C). Additionally, a PCVCSEL's seventh cladding-layer is constructed from a concentrically-graded N-doped (GaAlAs) "Gallium-Aluminum-Arsenide" ternary material 21A (FIGS. 8, 9, 19, and 19B); wherein, the ternary material's concentration of "Gallium" gradient will, starting from the seventh cladding-layer's bottom-edge, begin to gradually increase upward toward the PCVCSEL's fourth active-area (i.e., called Pump 2). For example the amount of "Gallium" gradient will begin to gradually increase from $Ga_{0.55}Al_{0.45}As$ 42A (FIG. 19B) to $Ga_{0.6}Al_{0.4}As$ 42B (FIG. 19B), to $Ga_{0.65}Al_{0.35}As$ 42C (FIG. 19B), to $Ga_{0.7}Al_{0.3}As$ 42D (FIG. 19B), to $Ga_{0.75}Al_{0.25}As$ 42E (FIG. 19B), and finally to $Ga_{0.8}Al_{0.2}As$ 42F (FIG. 19B).

Additionally, a ternary material's concentration of "Aluminum" gradient will, starting from the seventh cladding-layer's bottom-edge, begin to gradually decrease upward toward the PCVCSEL's fourth active-area (i.e., called Pump 2). For example, the amount of "Aluminum" gradient will begin to gradually decrease from $Ga_{0.55}Al_{0.45}As$ 42A (FIG. 19B) to $Ga_{0.6}Al_{0.4}As$ 42B (FIG. 19B), to $Ga_{0.65}Al_{0.35}As$ 42C (FIG. 19B), to $Ga_{0.7}Al_{0.3}As$ 42D (FIG. 19B), to $Ga_{0.75}Al_{0.25}As$ 42E (FIG. 19B), and finally to $Ga_{0.8}Al_{0.2}As$ 42F (FIG. 19B).

Furthermore, a seventh cladding-layer's dotted gradient boundary-lines 43A, 43B, 43C, 43D, 43E (FIG. 19B) illustrate that the graded amounts of "Gallium" and "Aluminum" materials present in the PCVCSEL's seventh cladding-layer are smoothly, proportionally, and evenly distributed across the seventh cladding-layer's vertical thickness.

Additionally, a ternary material's concentration of "Gallium" gradient will gradually increase from the seventh cladding-layer's thicker outer-perimeter inward toward the vertical-cavity's c-axis, where the PCVCSEL's seventh cladding-layer is optically thinner (i.e., having a lower refractive index). Moreover, the process of increasing the amounts of "Gallium" over "Aluminum" gradient material will equalize the refractive index across the seventh cladding-layer's whole horizontal-area.

In addition, a PCVCSEL's fourth active-area comprises. either a concave shaped SQW constructed from (GaAs) "Gallium-Arsenide", or a concave shaped MQW 211 (FIGS. 8, 9, 19, and 19C) having. six quantum wells constructed from (GaAs) "Gallium-Arsenide" 41A, 41B, 41C, 41D, 41E, 41F (FIG. 19C) and seven quantum well cladding-layers constructed from (GaAlAs) "Gallium-Aluminum-Arsenide" 40A, 40B, 40C, 40D, 40E, 40F, 40G (Fig 19C). Nevertheless, whatever structure is finally used as a PCVCSEL's fourth active-area the layers used to make up the PCVCSEL's fourth active-area should equal an optical thickness that is one quarter of one wavelength of the PCVCSEL's laser output emission.

For example, if a PCVCSEL device were designed to emit a wavelength of "800" nanometers, its fourth active-area's total optical thickness would need to be one-quarter of "800" nanometers to properly function. Therefore, a fourth active-area's total optical thickness would need to be "200" nanometers thick. Because a PCVCSEL's fourth active-area is made-up of multiple quantum wells and multiple quantum well cladding-layers the optical thicknesses of each of these different layers, when added together, should equal the required total optical thickness previously calculated.

Moreover, a PCVCSEL's fourth active-area will have six quantum wells constructed from (GaAs) "Gallium-Arsenide" 41A, 41B, 41C, 41D, 41E, 41F (FIG. 19C); wherein, each quantum well will have an optical thickness of "10" nanometers. Additionally, a PCVCSEL's fourth active-area will have seven quantum well cladding-layers constructed from (GaAlAs) "Gallium-Aluminum-Arsenide" 40A, 40B, 40C, 40D, 40E, 40F, 40G (FIG. 19C); wherein, each quantum well cladding-layer will have an optical thickness of "20" nanometers. Moreover, the combined thicknesses of the six quantum wells and the seven quantum well cladding-layers will equal "200" nanometers or one-quarter of one wavelength of a PCVCSEL's "800" nanometer laser output emissions.

In addition, is a PCVCSEL's eighth cladding-layer 21C (FIGS. 8, 9, 19, and 19A), which has a concave shaped bottom surface and a flat planar shaped top surface, and is positioned to contain the PCVCSEL's fourth active-area (i.e., called Pump 2) 21B (FIGS. 8, 9, 19, and 19C). Additionally, a PCVCSEL's eighth cladding-layer is constructed from a concentrically-graded P-doped (GaAlAs) "Gallium-Aluminum-Arsenide" ternary material 21C (FIGS. 8, 9, 19, and 19A); wherein, a ternary material's concentration of "Gallium" gradient will, starting from the eighth cladding-layer's top-edge, begin to gradually increase downward toward a PCVCSEL's fourth active-area (i.e., called Pump 2). For example, the amount of "Gallium" gradient will begin to gradually increase from $Ga_{0.55}Al_{0.45}As$ 44F (FIG. 19A) to $Ga_{0.6}Al_{0.4}As$ 44E (FIG. 19A), to $Ga_{0.65}Al_{0.35}As$ 44D (FIG. 19A), to $Ga_{0.7}Al_{0.3}As$ 44C (FIG. 19A), to $Ga_{0.75}Al_{0.25}As$ 44B (FIG. 19A), and finally to $Ga_{0.8}Al_{0.2}As$ 44A (FIG. 19A).

Additionally, a ternary material's concentration of "Aluminum" gradient will, starting from the eighth cladding-layer's top-edge, begin to gradually decrease downward toward a PCVCSEL's fourth active-area (i.e., called Pump 2). For example, the amount of "Aluminum" gradient will begin to gradually decrease from $Ga_{0.55}Al_{0.45}As$ 44F (FIG. 19A) to $Ga_{0.6}Al_{0.4}As$ 44E (FIG. 19A), to $Ga_{0.65}Al_{0.35}As$ 44D (FIG. 19A), to $Ga_{0.7}Al_{0.3}As$ 44C (FIG. 19A), to $Ga_{0.75}Al_{0.25}As$ 44B (FIG. 19A), and finally to $Ga_{0.8Al0.2}As$ 44A (FIG. 19A).

Furthermore, an eighth cladding-layer's dotted gradient boundary-lines 45B, 45D, 45C, 45B, 45A (FIG. 19A) illustrate that the graded amounts of "Gallium" and "Aluminum" materials present in a PCVCSEL's eighth cladding-layer are smoothly, proportionally, and evenly distributed across the eighth cladding-layer's vertical thickness.

Additionally, a ternary material's concentration of "Gallium" gradient will gradually increase from an eighth cladding-layer's thicker outer-perimeter inward toward the vertical-cavity's c-axis, where a PCVCSEL's eighth cladding-layer is optically thinner (i.e., having a lower refractive index). Moreover, the process of increasing the amounts of "Gallium" over "Aluminum" gradient material will equalize the refractive index across the eighth cladding-layer's whole horizontal-area.

In addition, is a PCVCSEL's fifth and last contact-layer 22 (FIGS. 7, 8, 9, and 19), which is constructed from a highly p+ doped (GaAs) "Gallium-Arsenide" binary material, and epitaxially grown upon the top outermost surface of the PCVCSEL's eighth cladding-region 21C (FIGS. 8, 9, 19, and 19A), giving the fifth contact-layer a position between the PCVCSEL's fourth and last active-region. Moreover, a fifth contact-layer 22 (FIGS. 7, 8, 9, and 19), while providing positive electrical connectivity to a PCVCSEL's fourth and last active-region 21 (FIGS. 8, 9, and 19), also enhances the reliability of the PCVCSEL design by preventing the migration of carrier-dislocations and the like to the PCVCSEL's fourth and last active-region 21 (FIGS. 8, 9, and 19).

In addition, is a PCVCSEL's semi-reflecting quarterwave DBR mirror-stack assembly, which is made from a plurality of layers 23 (FIGS. 8 and 9). For example, a plurality of one or more layers of (SiO2) "Fused Silica" 23A, 23C, 23E,

23G, 23I (FIGS. 8 and 9), and one or more layers of (ZnO) "Zinc-Oxide" 23B, 23X), 23F, 23H, 24 (FIGS. 8 and 9). For example, a layer of (SiO2) "Fused Silica" is epitaxially deposited upon the top outermost surface of a PCVCSEL's third and last contact-layer 23A (FIGS. 8 and 9), while a layer of (ZnO) "Zinc-Oxide" 23B (FIGS. 8 and 9) is subsequently and epitaxially deposited upon the top outermost surface of the previously deposited (SiO2) "Fused Silica" layer 23A (FIGS. 8 and 9); thereby, making a mirror pair of (SiO2/ZnO) reflectors 24 (FIGS. 8 and 9).

Moreover, if additional mirror-pairs are required, then several more layers of additional mirror-pairs can be deposited upon the top outermost surface of the last layer of the last existing mirror-pair of (SiO2) "Fused Silica"/(ZnO) "Zinc-Oxide" 24 (FIGS. 8 and 9). It should be understood that a semi-reflecting quarterwave DBR mirror-stack assembly serves as a PCVCSEL's top-positioned reflector 23, 24 (FIGS. 7, 8, and 9).

Moreover, a plurality of layers used to make-up the top-positioned quarterwave DBR mirror-stack assembly is formed from one to ten mirror-pairs, with a preferred number of mirror pairs ranging from four to five mirror-pairs. However, it should be understood that the number of mirror pairs could be adjusted for wavelength specific applications.

Figure 15:
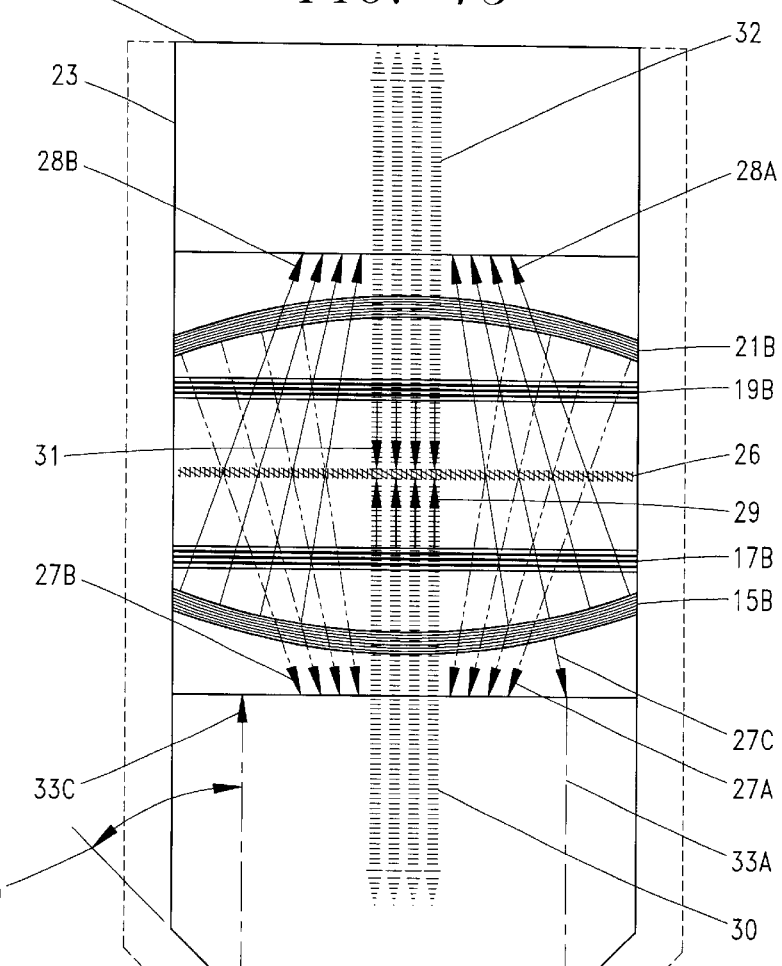
FIG. 15 is a ray-tracing logic diagram, displaying the phase-conjugate sixwave mixing as it occurs within a PCVCSEL device, demonstrating the production of two intracavity plane-parallel phase-conjugated distortion free wave-fronts.

Furthermore, a PCVCSEL's corner-cube prism waveguide 13 (FIGS. 7, 8, 9, 16, and 17) when used in conjunction with the ten (SiO2/ZnO) "Fused silica/Zinc-Oxide" mirror-pairs 23, 24 (FIGS. 7, 8, and 9) that make-up the device's only quarterwave DBR mirror-stack assembly 23 (FIG. 9), provides for approximately "99.00" percent of the PCVCSEL's reflectivity, while the other "1" percent is provided by an internally reflecting external cavity cladding material 25 (FIGS. 9 and 15).

FIGS. 9, 10, 11, 12, 16, and 17—Additional Embodiments

Figure 10:
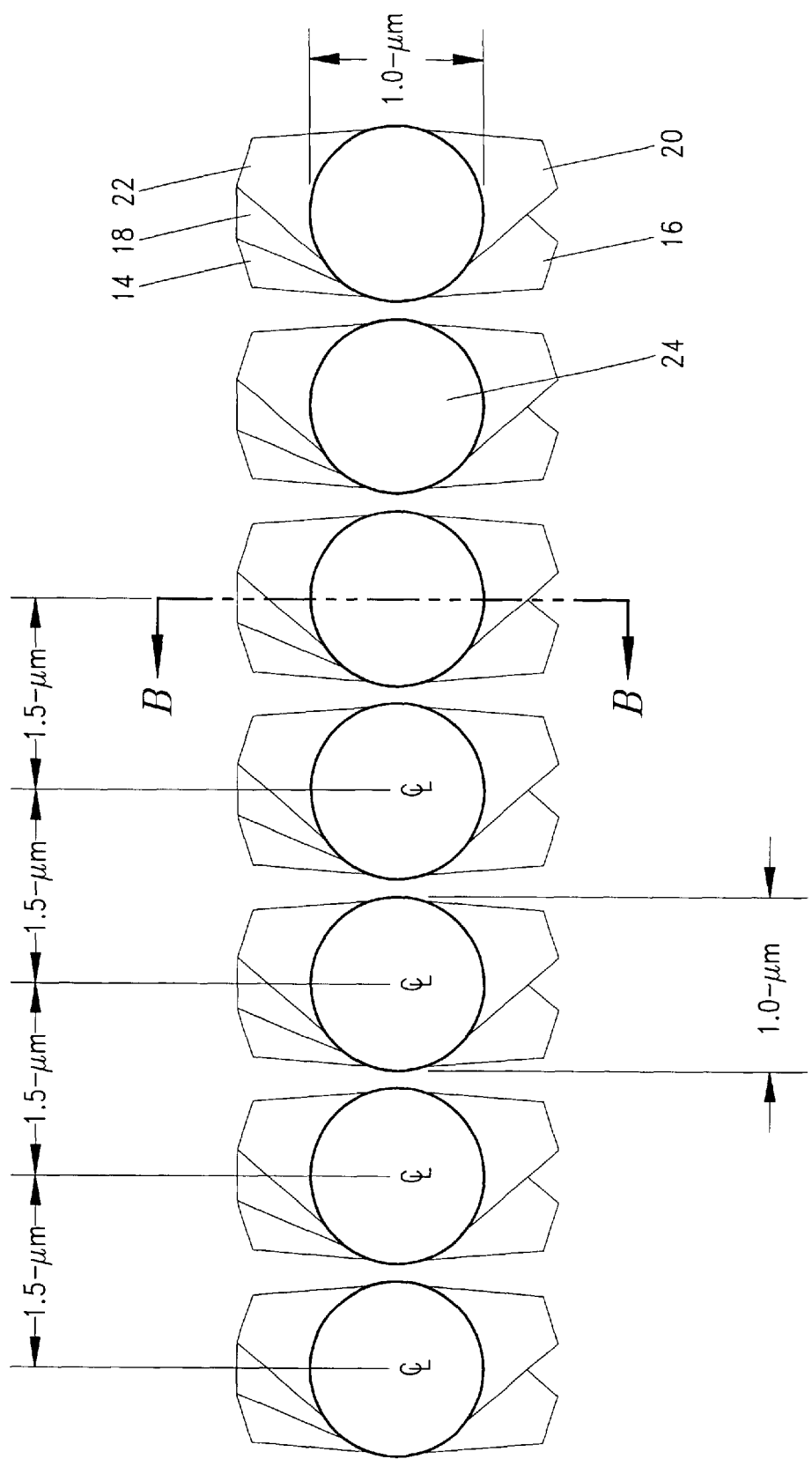
FIG. 10 is an orthographic plan-view drawing of a linear array of seven mesa-etched PCVCSELs, illustrating each PCVCSEL device having four MQW active-regions, one plane-parallel mirror-stack, and one internal reflecting corner-cube prism waveguide, while displaying PCVCSEL emitter diameter, layout spacing, and centerline dimensions, as well.
Figure 12:
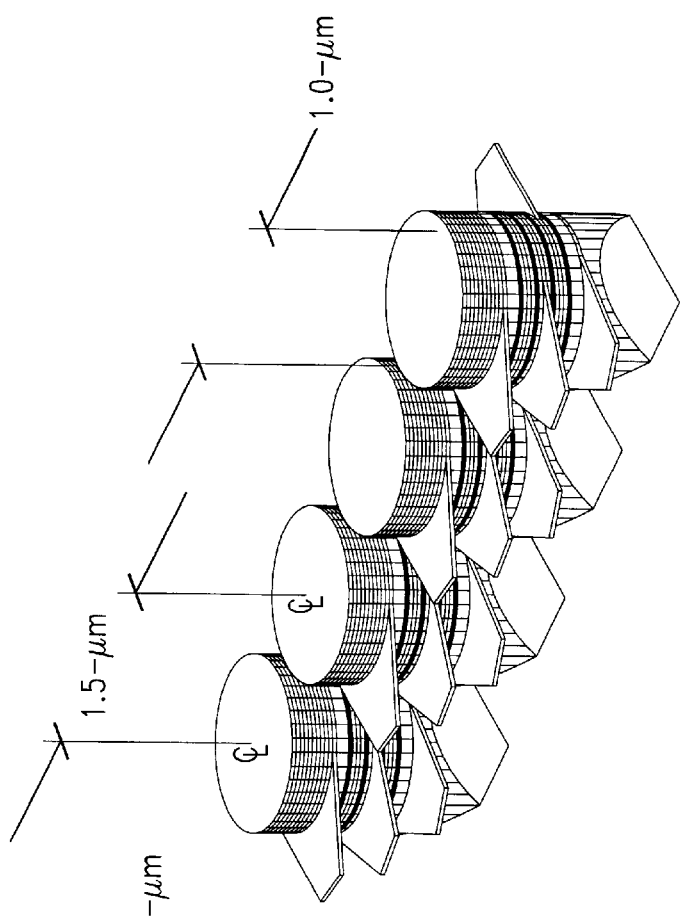
FIG. 12 is a 3D isometric top-left side-view drawing of four mesa-etched PCVCSELs, illustrating PCVCSEL emitter diameters and centerline-to-centerline dimensions.
Figure 11:
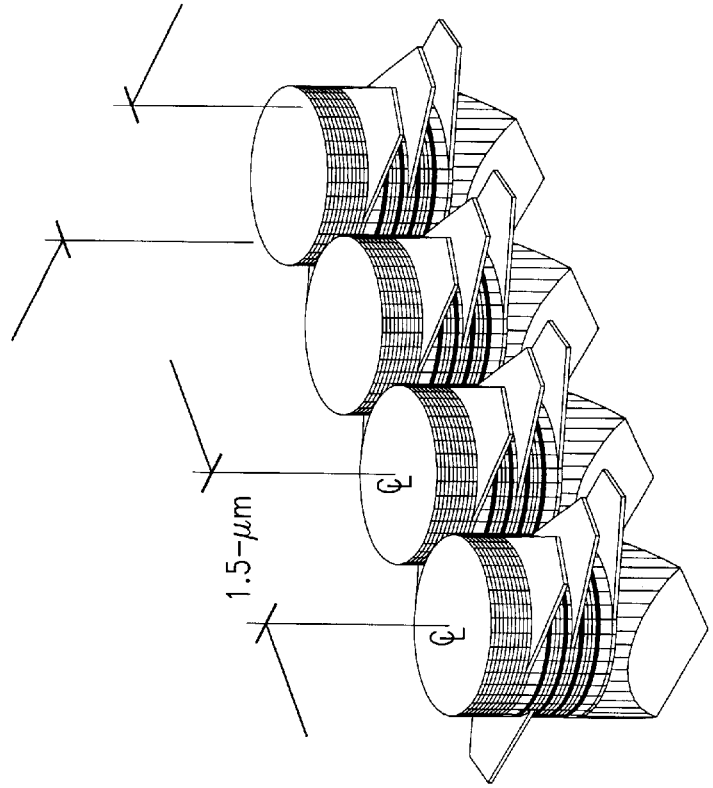
FIG. 11 is a 3D isometric top-right side-view drawing of four mesa-etched PCVCSELs, illustrating PCVCSEL emitter diameters and centerline-to-centerline dimensions.

The first additional embodiment of the present invention is that a PCVCSEL's multiple active-areas 15B, 17B, 19B, 21B (FIGS. 7, 8, 9, and 15), which are located within the PCVCSEL's vertical-cavity are used to produce a semiconductor laser with an emitter size smaller than "2.0" microns in diameter, as illustrated in FIGS. 10, 11, and 12. Typically, VCSELs with smaller than "2.0" micron size diameters is not possible with current prior-art designs, Currently, prior-art VCSEL designs having single p-n junction active-areas, after reaching down to a diameter size of about "2.0" microns can not produce enough photonic energy within their vertical-cavities to bring about a device's stimulated emission and amplification of fundamental light into laser output emission. However, by using multiple active-areas, we can design and construct smaller VCSEL devices with smaller emitter sizes, while maintaining the proper amounts of intracavity photonic energy necessary for the stimulated emission and the amplification of laser radiation.

Another additional embodiment of the present invention is that by controlling the switching and/or distribution of electric current to a PCVCSEL's various electrically un-isolated active-region's active-areas 15B, 17B, 19B, 21B (FIG. 9), which are located within the PCVCSEL's vertical-cavity, various short-pulsed (i.e., chirped) and/or the continuously working output of laser emissions can be achieved.

Another additional embodiment of the present invention is that by controlling the switching and/or distribution of electric current to a PCVCSEL's various electrically un-isolated active-region's active-areas 15B, 17B, 19B, 21B (FIG. 9), which are located within the PCVCSEL's vertical-cavity, a controlled on and off switching between 'small-period reflection-gratings' and 'large-period transmission-gratings' can be achieved within the PCVCSEL device.

Another additional embodiment of the present invention is the use of an internal reflecting corner-cube prism waveguide 13 (FIGS. 7, 8, 9, 15, 16, and 17), which is composed of (SiO2) "Fused Silica" a material that will reflect "100" percent any optical radiation having a wavelength between "150" and "4.0" micrometers that enters the corner-cube prism waveguide's normal horizontal front-face surface 13D (FIGS. 16 and 17).

Moreover, a PCVCSEL's corner-cube prism waveguide is exactly what its name implies, a prism waveguide with the shape of a cube's corner cut off orthogonal to one of its triad (i.e., body-diagonal) axes 13A, 13B, 13C (FIGS. 16 and 17); wherein, the front-face surface of the resultant prism has a circular shape 13D (FIGS. 16 and 17).

Furthermore, as a result of three totally internal reflections 13A, 13B, 13C (FIGS. 16 and 17) caused by three prism facets, an incident light ray is totally reflected along a parallel-line backwards into its original direction 33 (FIGS. 16 and 17), no matter what angle of incidence the previously mentioned light-ray had entered the normal horizontal front-face surface 13D (FIGS. 16 and 17) of the PCVCSEL's corner-cube prism waveguide 33 (FIGS. 16 and 17).

Therefore, a light-ray reflected by the corner-cube prim waveguide is shifted laterally by an amount that depends on the light-ray's 33 (FIGS. 16 and 17) angle of incidence and point of entry on the normal horizontal front-face surface 13D (FIGS. 16 and 17) of the corner-cube prism waveguide 13 (FIGS. 16 and 17). The location of a PCVCSEL's corner-cube prism waveguide 13 (FIGS. 7, 8, 9, 15, 16, and 17) is at the base of the PCVCSEL's vertical-cavity 13 (FIGS. 7, 8, 9, 15, 16, and 17), replacing the primary quarterwave DBR mirror-stack assembly normally used in current prior-art VCSEL designs.

Another additional embodiment of the present invention, as illustrated in FIGS. 7 and 8, is a PCVCSEL's use as a single laser device. For example, like the single semiconductor diode lasers currently used in multi-media technologies like "Digital Video Disk" (DVD) player/recorders, "Compact Disk" (CD) player/recorders, "Magneto-Optical" (MO) player/recorders. "Mini Disk" (MD) player/recorders, and also in the next generation of rear-projection television (i.e., signal devices that are replacing the prior-art electron guns of current technology).

Additionally, for example, like the single semiconductor diode lasers currently used in telecommunication technologies like fiber-optic short and long-haul communication devices. Additionally, for example, like the single semiconductor diode lasers currently used in mass data-storage technologies like magneto-optical flying-head hard disk drives.

Another additional embodiment of the present invention, as illustrated in FIGS. 10, 11, and 12, is the use of multiple PCVCSELs in two-dimensional row-and-column laser-arrays and two-dimensional linear laser-arrays. For example, like the two-dimensional row-and-column laser-arrays currently used in solid-state laser-pumping technologies, Additionally, for example, like the two-dimensional row-and-column laser-arrays currently used in video-display micro-screen technologies. Additionally, for example, like the two-dimensional linear laser-arrays currently used in flatbed image scanners, hand-held image scanners, laser printers, and other raster-image reproduction technologies.

Another additional embodiment of the present invention is that multiple PCVCSEL devices contained within a single laser-array (FIGS. 10, 11, and 12) can be configured as singularly controlled laser devices, or can be equally configured as a singularly controlled unit of multiple lasers, While, the control over PCVCSEL devices contained on a single substrate is accomplished through a (GaAs) "Gallium-Arsenide" based semiconductor's control-bus, memory-bus, and address-bus control circuitry, which is created along with the PCVCSEL devices using the same (GaAs) "Gallium-Arsenide" semiconductor substrate material used in the construction of the PCVCSELs; wherein, the PCVCSEL lasers and their control circuitry is configured as a single integrated-circuit chip device.

Another additional embodiment of the present invention, as illustrated in FIG. 9, is the addition of a cladding material to a PCVCSEL's vertical and outermost wall surfaces 25 (FIG. 9). Having a refractive index that is less than that of the semiconductor material 24 (Pig 9) used in the construction of a PCVCSEL's vertical-cavity, the cladding material 25 (FIG. 9) is deposited around and/or between every mesa-etched PCVCSEL. The cladding material 25 will provide each PCVCSEL's vertical outermost wall-surface with an internal reflectivity of about a "100" percent. The previously mentioned internal reflectivity will be for intracavity produced light-rays having an angle of incidence that is less than "30" degrees from the vertical-cavity's outermost walls-surfaces 33D (FIG. 15).

For example, the sputtered deposition of a material like (LiF) "Lithium-Fluoride", which is an optical material having a much lower refractive index than (GaAs) "Gallium-Arsenide" and (GaAlAs) "Gallium-Aluminum-Arsenide" the nonlinear semiconductor materials used in the construction of a PCVCSEL's vertical-cavity. The (LiF) "Lithium-Fluoride" optical cladding material should typically be deposited on and/or around a PCVCSEL's outer-wall-surface 25 (FIG. 9), while excluding the PCVCSEL's top emitter-layer, which is located at the top of the PCVCSEL's quarterwave DBR mirror-stack assembly. Achieving, an internal reflectivity of about a "100" percent for each PCVCSEL device(s) the previously mentioned cladding material is deposited around.

Furthermore, a PCVCSEL's cladding material works in much the same way as a cladding material does when it is used around optical fiber. For example, when a cladding material having an lower refractive index than the material used in the optical-fiber's core is deposited onto the core's outermost surface it will achieve an internal reflectivity of about a "100" percent for intrafiber traveling light-rays having an angle of incidence less than "30" degrees from the core's outermost wall-surface and the cladding-layer's innermost wall-surface.

Advantages

From the description above, a number of advantages of my vertical cavity surface emitting laser that uses intracavity degenerate four wave mixing to produce phase-conjugated and distortion free collimated laser light become evident:

(a) The output of a phase-conjugated (i.e., a distortion eliminating wave-front reversed laser beam) laser beam 30, 32 (FIG. 15), which is generated and reflected via a first and/or second "reflection-grating" is convergent, distortion-free, and plane-parallel.

(b) Because a phase-conjugation vertical-cavity surface-emitting laser comprises an 'n+-N-i-P-p+-P-i-N-n+-N-i-P-p+-P-i-N-n+' or 'p+-P-i-N-n+-N-i-P-p+-P-i-N-n+-N-i-P-p+' 15, 17, 19, 21 (FIG. 9) contact-layer-sharing quadruple-heterostructure diode-laser architecture, an effective control over the amount and propagation direction of intracavity produce multiple counter-propagating phase-matched photonic wave-fronts can be utilized to selectively switch between the intracavity production of 'small-period reflection-gratings' and 'large-period transmission-gratings'.

(c) The total elimination, along with the manufacturing processes associated with their construction of what is typically known in prior-art VCSEL diode laser design as primary quarterwave DBR mirror-stack assemblies, or base quarterwave DBR mirror-stack reflectors, which are replaced, as illustrated in FIGS. 7, 8, 9, and 15, by the present inventions monolayered cornercube prism waveguide 13, (d) The use of a corner-cube prism waveguide, which is located at the base of the present invention's vertical-cavity and replaces the more conventional metallic-alloy or sapphire substrates and/or planar-flat multilayered primary quarterwave DBR mirror-stack assemblies 3 (FIGS. 1, 2, and 3) normally used in prior-art VCSEL designs with a single layered monolithic structure that transmits any and/or all wavelengths of optical radiation produced by a PCVCSEL's active-region.

(e) The corner-cube prism waveguide 13 used in the present invention is monostructural (i.e., formed into a single shape from a single material) polyhedron, which is geometrically complex, but structurally simply, as opposed to quarterwave DBR mirror-stack assemblies 3 used in prior-art VCSEL diode lasers, which are geometrically simple, but structurally complex, and comprise multilayered structures having a multitude of epitaxially and alternately deposited thin-film planar-flat quarterwave plates that are constructed from materials having opposed refractive indices.

(f) The present invention's monostructural corner-cube prism waveguide 13 (FIGS. 7, 8, 9, and 15), when constructed from (Si2O) "Fused Silica" is inexpensive and easy to manufacture, as opposed to quarterwave DBR mirror-stack assemblies.

(g) The present invention's monostructural corner-cube prism waveguide 13 (FIGS. 7, 8, 9, and 15), when constructed from (Si2O) "Fused Silica" is moisture resistant, as opposed to some quarterwave DBR mirror-stack assemblies.

(h) The present invention's monostructural corner-cube prism waveguide 13 (FIGS. 7, 8, 9, and 15), when constructed from (Si2O) "Fused Silica" is resistant to heat, as opposed to some quarterwave DBR mirror-stack assemblies.

(i) The present invention's monostructural corner-cube prism waveguide 13 (FIGS. 7, 8, 9, and 15), when constructed from (Si2O) "Fused Silica" is non-conductive, as opposed to some quarterwave DBR mirror-stack assemblies.

(j) The present invention's monostructural corner-cube prism waveguide 13 (FIGS. 7, 8, 9, and 15), when constructed from (Si2O) "Fused Silica" is non-polarizing to intracavity produced light, as opposed to some quarterwave DBR mirror-stack assemblies.

(k) The present invention's monostructural corner-cube prism waveguide 13 (FIGS. 7, 8, 9, and 15), when constructed from (Si2O) "Fused Silica" is amorphous (i.e., a material made up of molecules that lack a distinct crystalline structure) and therefore, has an absolute lattice-mismatch to diode constructing semiconductor materials like (GaAs) "Gallium-Arsenide" and (AlGaAs) "Aluminum-Gallium-Arsenide, and to other Zinc-blend semiconductor materials, as well. This tends to promote greater reflectivity at the material interface between a PCVCSEL's first contact-layer 14 (FIGS. 7, 8, 9, and 15) and the PCVCSEL's corner-cube prism waveguide.

(l) The present invention's monostructural corner-cube prism waveguide 13 (FIGS. 7, 8, 9, and 15), by having a transverse light reflecting geometry, the waveguide, by folding back onto itself the laser's vertical-cavity has the ability to internally redirect "180" degrees all optical radiation that enters its plane-parallel, flat-horizontal, and normal top front-face surface 13D (FIGS. 16 and 17).

(m) The present invention's monostructural corner-cube prism waveguide 13 (FIGS. 7, 8, 9, and 15) also increases the present invention's modal-discrimination by extending a diode laser's optical cavity length, which introduces loss to the diode laser's higher moded light and therefore introduces gain to the diode laser's fundamental moded light, which in turn produces fundamental lower moded laser-light output emission.

Operation—FIGS. 13, 14, 15, and 16

The manner of using the present invention is based upon a method to incorporate a process of intracavity degenerate four-wave mixing into a VCSEL diode laser design. The present invention is called a "Phase-Conjugation Vertical Cavity Surface Emitting Laser" (PCVCSEL), which would produce phase-conjugated, convergent, distortion free (i e., reversal of intracavity distortions like diffraction, divergence, and light-scattering), and collimated (i.e., plane parallel phase fronts) laser output emission, Moreover, the degenerative four-wave mixing (i.e., called four-wave mixing because there are four frequencies of phase-matched laser beam light involved in the phase-conjugate process) 27A, 27B, 28A, 28B, 30, 32 (FIG. 15) that occurs within the nonlinear material 50 (FIG. 13), 64 (FIG. 14) used to construct a PCVCSEL diode laser is called 'intracavity' because the process of phase-conjugation occurs inside the PCVCSEL's vertical-cavity between two feedback providing light-reflecting structures (i.e., sometimes called mirrors).

Moreover, the semiconductor materials used in the construction of a PCVCSEL's vertical-cavity are nonlinear; therefore, they exhibit third-order susceptibilities necessary in producing a phase-conjugated mirror 26 (FIG. 15). The nonlinear materials that exhibit third-order susceptibilities are not limited to binary semiconductor materials like (GaAs) "Gallium-Arsenide", (InAs) "Indium-Arsenide", (InP) "Indium-Phosphide", and (GaSb) "Gallium-Antimonide", semiconductor materials that have a 'Cubic' crystal-symmetry of 'Class-F43m'and a space-group of "216", but are also exhibited in photo-refractive materials like (KDP) "Potassium-Dihydrogen-Phosphate", and (ADP) "Ammonium-Dihydrogen-Phosphate", photo-refractive materials that have a 'Tetragonal' crystal-symmetry of 'Class-142d' and a space-group of "122". Therefore, certain nonlinear photo-refractive can also be used in the construction of a PCVCSEL's vertical-cavity 50 (FIG. 13), 64 (FIG. 14) and therefore, used for the production of phase-conjugated and distortion free laser output emission.

Figure 13:
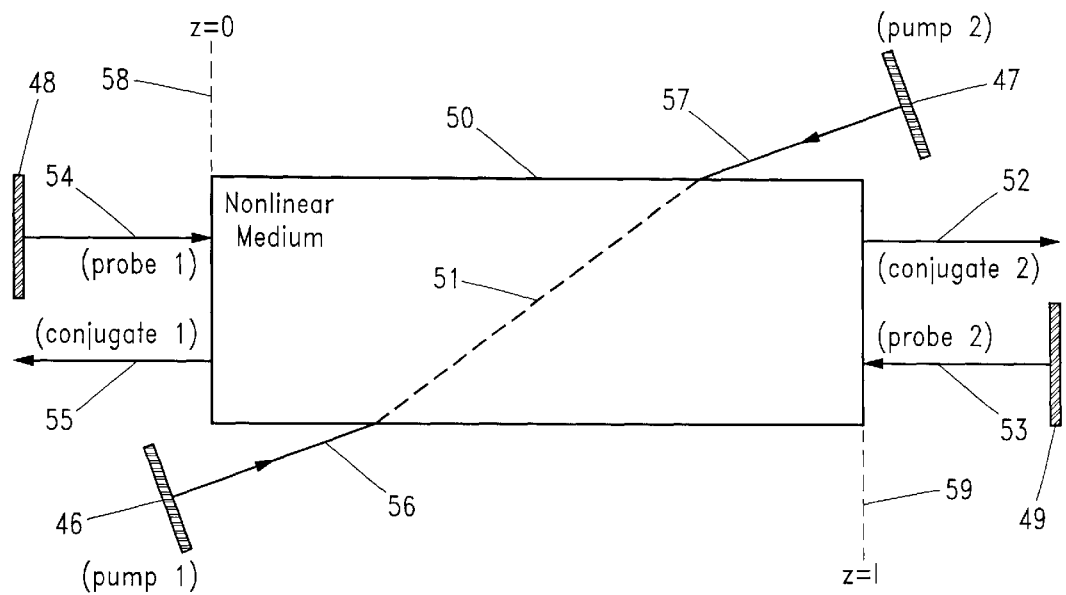
FIG. 13 is a ray-tracing block diagram, displaying a typical geometry for prior-art degenerate four-wave phase-conjugate mixing.

In addition, is a four-wave mixing geometry, as illustrated in FIG. 13, which is currently used by prior-art to produce phase-conjugated optical radiation within bulk nonlinear materials (e,g., Potassium-Dihydrogen-Phosphate and Ammonium-Dihydrogen-Phosphate). As presented in and, taught by the prior-art (FIG. 13) the process of four-wave mixing typically begins by using two coherent sources of external optical radiation (i.e., laserlight) to form interference gratings in the previously mentioned bulk nonlinear material, these coherent sources of laser-light are typically labeled as "Pump 1" 46 (FIG. 13) and as "Pump 2" 47 (FIG. 13). By focusing two coherent sources of laser-light, labeled as "Pump 1" 46 (FIG. 13) and as "Pump 2" 47 (FIG. 13), into a bulk nonlinear material 50 (FIG. 13) like KDP or ADP at the correct off-axis angle of incidence 56, 57 (FIG. 13), two different types of spatial gratings 51 (FIG. 13) can be made to form at the center of the previously mentioned bulk nonlinear material 51 (FIG. 13). A PCVCSEL uses a four-wave mixing geometry that is different from the mixing geometry used by the presented prior-art. A PCVCSEL uses a four-wave mixing geometry that is based upon -the use of thin nonlinear materials (e.g., Gallium-Arsenide or Indium-Arsenide) as its mixing medium.

Additionally, wave-fronts 27A, 27B, 28A, 28B (FIG. 15) produced by a PCVCSEL's two active-area internal laser pumps 15B, 21B (FIG. 15) (i.e., called Pump 1 and Pump 2) will intersect 26 (FIG. 15) with wave-fronts 29, 31 (FIG. 15) produced by the PCVCSEL's other two active-area internal laser probes 17B, 19B (FIG. 15) (i.e., called Probe 1 and Probe 2) within a thin nonlinear material 50 (FIG. 13), 64 (FIG. 14), which is located at the center of a PCVCSEL's vertical-cavity, The previously mentioned intersections will cause small and large spatial-gratings 51 (FIG. 13), 65 (FIG. 14) to form within a thin nonlinear material 50 (FIG. 13), 64 (FIG. 14), which in turn are used to create a PCVCSEL's phase-conjugate mirror. A PCVCSEL using the previously mentioned four-wave mixing geometry for thin nonlinear material will cause two different spatial gratings 51 (FIG. 13) to form within its thin nonlinear material mixing medium, which is also, for the preferred embodiment, the material used for constructing a PCVCSEL's four active-regions.

However, before proceeding with any descriptions of the present invention's operation, as an overview, lets take a closer look at the geometry currently used in prior-art 'degenerate four-wave mixing', as illustrated in FIG. 13.

In addition, as taught in the prior-art, a four-wave mixing geometry is typically used to create a first type of spatial grating called 'small period-grating' 51 (FIG. 13). By using the previously mentioned geometry, as illustrated in FIG. 13, the previously mentioned 'small period-grating' is written within a bulk nonlinear material like ADP.

For example, a 'small period-grating' is written within a nonlinear material by pump-one's 46 (FIG. 13) external (i.e., external meaning the laser used to produce spatial gratings is outside the nonlinear material) laser-beam number "1" 56 (FIG. 13), as it intersects within the bulk nonlinear material with probe-two's 49 (FIG. 13) external laser-beam number "2" 53 (FIG. 13). The resulting interference, will in turn, form a 'small period-grating' 51 at the center of the mixing geometry's bulk nonlinear material 50 (FIG. 13).

Moreover, a 'reflection-grating' is written when probe-one's 48 (FIG. 13) laser-beam-number "1" 54 (FIG. 13) back-scatters off the 'small period-grating' written by pump-one 's 46 (FIG. 13) external laser-beam number "1" 56 (FIG. 13) as it intersects with probe-two's 49 (FIG. 13) external laser-beam number "2" 53 (FIG. 13). A 'reflection-grating' will generate a counter propagating and distortion removing phase-conjugate laser-beam number "4" 55 of probe-one's 48 (FIG. 13) external laser-beam number "3" 54 (FIG. 13).

Additionally, as an alternative example, a 'small period-grating' is written within a bulk nonlinear material by pump-two's 47 (FIG. 13) external laser-beam number "1" 57 (FIG. 13), as it intersects within the bulk nonlinear material with probe-one's 48 (FIG. 13) external laser-beam number "2" 54 (FIG. 13). The resulting interference, will in turn, for m a 'small period-grating' 51 at the center of the mixing geometry's bulk nonlinear material 50 (FIG. 13).

Moreover, a 'reflection-grating' is written when probe-two's 49 (FIG. 13) external laser-beam number "1" 53 (FIG. 13 ) back-scatters off the 'small period-grating' written by pump-two's 47 (FIG. 13) external laser-beam number "1" 57 (FIG. 13), as it intersects with probe-one's 48 (FIG. 13) external laser-beam number "2" 54 (FIG. 13). Additionally, a 'reflection-grating' will generate a counter propagating and distortion removing phase-conjugate laser-beam number "4" 52 of probe-two's 49 (FIG. 13) external laser-beam number "3" 53 (FIG. 13). The two phase-conjugated number "4" laser beams 55, 52 generated by the two 'reflection-grating' examples are shown by prior-art to be convergent, distortion-free, and plane-parallel.

In addition, as presented by prior-art, a four-wave mixing geometry is also typically used to create a second type of spatial grating called 'large period-grating' 51 (FIG. 13). By using the geometry, as illustrated in FIG. 13, the previously mentioned 'large period-grating' is written within a bulk nonlinear material (e.g., ADP).

For example, a 'large period-grating' is written within a bulk nonlinear material by pump-one's 46 (FIG. 13) external (i.e., external meaning the laser used to produce spatial gratings is outside the nonlinear material) laser-beam number "1" 56 (FIG. 13) as it intersects within the bulk nonlinear material with probe-one's 48 (FIG. 13) external laser-beam number "2" 54 (FIG. 13), The resulting interference, will in turn, form a 'large period-grating' 51 at the center of the mixing geometry's bulk nonlinear material 50 (FIG. 13). Moreover, a 'transmission-grating' is written when probe-two's 49 (FIG. 13) external laser-beam number "3" 53 (FIG. 13) back-scatters off the 'large period-grating' written by pump-one's 46 (FIG. 13) external laser-beam number "1" 56 (FIG. 13) as it intersects with probe-one's 48 (FIG. 13) external laser-beam number "2" 54 (FIG. 13). A 'transmission-grating' will generate a forward propagating and distortion removing phase-conjugate laser-beam number "4" 55 of probe-two's 49 (FIG. 13) external laser-beam number "3" 53 (FIG. 13).

Additionally, as an alternative example, a 'large period-grating' is written within a bulk nonlinear material by pump-two's 47 (FIG. 13) external laser-beam number "1" 57 (FIG. 13) as it intersects within the bulk nonlinear material with probe-two's 49 (FIG. 13) external laser-beam number "2" 53 (FIG. 13). The resulting interference, will in turn, form a 'large period-grating' 51 at the center of the mixing geometry's bulk nonlinear material 50 (FIG. 13).

Moreover , a 'transmission-grating' is written when probe-one's 48 (FIG. 13) external laser-beam number "1" 54 (FIG. 13) back-scatters off the 'large period-grating' written by pump-two's 47 (FIG. 13) external laser-beam number "1" 57 (FIG. 13) as it intersects with probe-two's 49 (FIG. 13) external laser-beam number "2" 53 (FIG. 13). A 'transmission-grating' will generate a forward propagating and distortion removing phase-conjugate laser-beam 52 of probe-one's 48 (FIG. 13) external laser-beam number "3" 54 (FIG. 13). The two phase-conjugated laser beams 55, 52 generated by the two 'transmission-grating' examples are shown by prior-art to be convergent, distortion-free, and plane-parallel.

Figure 14:
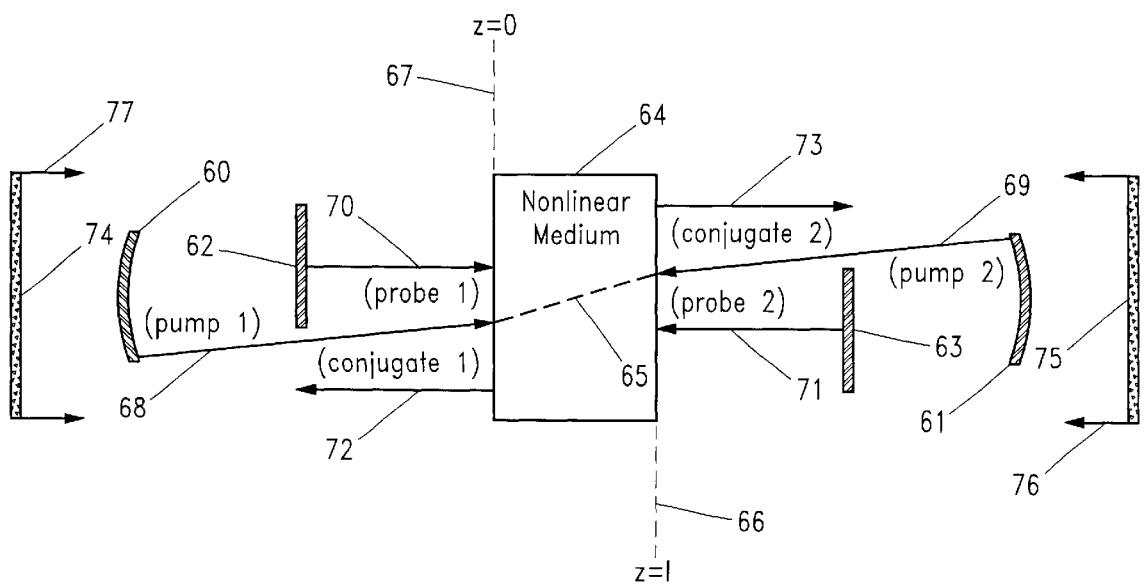
FIG. 14 is a ray-tracing block diagram, displaying a four-wave phase-conjugate mixing configuration for the PCVCSEL design.

In addition, as illustrated in FIG. 14, is the present inventions mixing geometry, which is used to model the intracavity degenerate four-wave mixing used in the PCVCSEL design. If the nonlinear material medium used in a PCVCSEL's vertical-cavity is isotropic 64 (FIG. 14), and we use "Degenerate Four-Wave Mixing" (DFWM), we still create the same spatial gratings 65 (FIG. 14) previously mentioned (i.e., reflective-grating and transmission-grating), but using a different mixing geometry more relevant to PCVCSEL design.

Moreover, as illustrated in FIG. 14, a four-wave mixing geometry is typically used to create a first type of spatial grating called 'small period-grating' 64 (FIG. 14). By using the geometry, as illustrated in FIG. 14, the previously mentioned "small period-grating" is written within a thin nonlinear material (e.g., like GaAs).

For example, a 'small period-grating' is written within a thin nonlinear material by pump-one's 60 (FIG. 14) internal (i.e., internal meaning the laser beams used to produce spatial gratings are created inside the laser cavity containing the thin nonlinear material) laser-beam number "1" 68 (FIG. 14) as it intersects within the thin nonlinear material with probe-two's 63 (FIG. 14) internal laser-beam number "2" 71 (FIG. 14). The resulting interference, will in turn, form a 'small period-grating' 64 at the center of the mixing geometry's thin nonlinear material 64 (FIG. 13).

Moreover, a 'reflection-grating' is written when probe-one's 62 (FIG. 14) internal laser-beam number "1" 70 (FIG. 14) back-scatters off the 'small period-grating' written by pump-one's 60 (FIG. 14) internal laser-beam number "1" 68 (FIG. 14) as it intersects with probe-two's 63 (FIG. 14) internal laser-beam number "2" 71 (FIG. 14). A 'reflection-grating' will generate the counter propagating and distortion removing phase-conjugate laser-beam number "4" 72 of probe-one's 62 (FIG. 14) internal laser-beam number "3" 70 (FIG. 14).

Additionally, as an alternative example, a 'small period-grating' is written within a thin nonlinear material by pump-two's 61 (FIG. 14) internal laser-beam number "1" 69 (FIG. 14) as it intersects within the thin nonlinear material with probe-one's 62 (FIG. 14) internal laser-beam number "2" 70 (FIG. 14). The resulting interference, will in turn, form a 'small period-grating' 65 at the center of the mixing geometry's thin nonlinear material 64 (FIG. 14).

Moreover, a 'reflection-grating' is written when probe-two's 63 (FIG. 14) internal laser-beam number "1" 71 (FIG. 14) back-scatters off the 'small period-grating' written by pump-two's 61 (FIG. 14) internal laser-beam number "1" 69 (FIG. 14) as it intersects with probe-one's 62 (FIG. 14) internal laser-beam number "2" 70 (FIG. 14). A 'reflection-grating' will generate a counter propagating and distortion removing phase-conjugate laser-beam number "4" 73 of probe-two's 63 (FIG. 14) internal laser-beam number "3" 71 (FIG. 14). The two phase-conjugated number "4" laser beams 72, 73 generated by the 'reflection-grating' examples are shown by the present invention to be convergent, distortion-free, and plane-parallel.

In addition, as illustrated in FIG. 14, a four-wave mixing geometry is also used to create a second type of spatial grating called 'large period-grating' 65 (FIG. 14). By using the geometry, as illustrated in FIG. 14, the previously mentioned 'large period-grating' is written within a thin nonlinear material (e.g., like Ga—As).

For example, a 'large period-grating' is written within a thin nonlinear material by pump-one's 60 (FIG. 14) internal (i.e., internal meaning the lasers used to produce spatial gratings are created inside the laser cavity containing the thin nonlinear material) laser-beam number "1" 68 (FIG. 14) as it intersects within the thin nonlinear material with probe-one's 62 (FIG. 14) internal laser-beam number "2" 70 (FIG. 14). The resulting interference, will in turn, form a 'large period-grating' 65 at the center of the mixing geometry's thin nonlinear material 64 (FIG. 14).

Moreover, a 'transmission-grating' is written when probe-two's 63 (FIG. 14) internal laser-beam number "3" 71 (FIG. 14) back-scatters off the 'large period-grating' written by pump-one's 60 (FIG. 14) internal laser-beam number "1" 68 (FIG. 14) as it intersects with probe-one's 62 (FIG. 14) internal laser-beam number "2" 70 (FIG. 14). A 'transmission-grating' will generate a forward propagating and distortion removing phase-conjugate laser-beam number "4" 72 of probe-two's 63 (FIG. 14) internal laser-beam number "3" 71 (FIG. 14).

Additionally, as an alternative example, a 'large period-grating' is written within a thin nonlinear material by pump-two's 61 (FIG. 14) internal laser-beam number "1" 69 (FIG. 14) as it intersects within the thin nonlinear material with probe-two's 63 (FIG. 14) internal laser-beam number "2" 71 (FIG. 14). The resulting interference, will in turn, form a 'large period-grating' 65 at the center of the mixing geometry's thin nonlinear material 64 (FIG. 14).

Moreover, a 'transmission-grating' is written when probe-one's 62 (FIG. 14) internal laser-beam number "1" 70 (FIG. 14) back-scatters off the 'large period-grating' written by pump-two's 61 (FIG. 14) internal laser-beam number "1" 69 (Pig 14) as it intersects with probe-two's 63 (FIG. 14) internal laser-beam number "2" 71 (FIG. 14). A 'transmission-grating' will generate a forward propagating and distortion removing phase-conjugate laser-beam 73 of probe-one's 62 (FIG. 14) internal laser-beam number "3" 70 (FIG. 14). The two phase-conjugated laser beams 72, 73 generated by the 'transmission-grating' examples are shown by the present invention to be convergent, distortion-free, and plane-parallel.

In addition, as illustrated in FIG. 15, is the present invention's usage of a PCVCSEL's structural geometry to describe the present invention's degenerative intracavity four-wave mixing, and how it specifically uses the PCVCSEL's structures to generate two different types of spatial gratings 26 (FIG. 15) within the PCVCSEL's vertical-cavity, and how they are used to create two different types of phase-conjugated laser-beam emissions 30, 32 (FIG. 15).

Moreover, the laser-light emission wave-fronts produced by pump-one's 60 (FIG. 14) active-area 15B (FIG. 15) have a negative radius of curvature, causing phase-waves that pump-one's active-area 15B produces to have a concave shape about its source. Additionally, the laser-light emission wave-fronts produced by pump-two's 61 (FIG. 14) active-area 21B (FIG. 15) will also have a negative radius of curvature, causing phase-waves that pump-two's active-area 21B produces to have a concave shape about its source, which are counter propagating to the emission phase-waves produced by pump-one's 60 (FIG. 14) internal laser-beam number "1" 68 (FIG. 14).

In addition, as illustrated in FIG. 15, is the present invention's mixing geometry, which is used to model the intracavity degenerate four-wave mixing, used by a PCVCSEL. If the thin nonlinear material medium used in a PCVCSEL's vertical-cavity is isotropic 64 (FIG. 14), and we use "Degenerate Four-Wave Mixing" (DFWM), we will create the same two spatial gratings 65 (FIG. 14) mentioned earlier (i.e., reflective-grating and transmission-grating), but using a different mixing geometry that is more relevant to the PCVCSEL design.

Moreover, as illustrated in FIG. 15, a four-wave mixing geometry is typically used to create a first type of spatial grating called 'small period-grating' 26 (FIG. 15). By using the geometry, as illustrated in FIG. 15, the previously mentioned "small period-grating" is written within a thin nonlinear material 18 (FIG. 9) (e.g., like GaAs).

For example, a 'small period-grating' is written within a thin nonlinear material by pump-one's 15B (FIG. 15) internal (i.e., internal meaning the laser beams used to produce spatial gratings are created inside the laser cavity containing the thin nonlinear material) laser-beam number "1" 28A, 28B (FIG. 15), as it intersects within the thin nonlinear material 18 with probe-two's 19B (FIG. 15) internal laser-beam number "2" 31 (FIG. 15). The resulting interference, will in turn, form a 'small period-grating' 26 at the center of the mixing geometry's thin nonlinear material 18 (FIG. 9).

Moreover, a 'reflection-grating' is written when probe-one's 17B (FIG. 15) internal laser-beam number "1" 29 (FIG. 15) back-scatters off the 'small period-grating' written by pump-one's 15B (FIG. 15) internal laser-beam number "1" 28A, 28B (FIG. 15) as it intersects with probe-two's 19B (FIG. 15) internal laser-beam number "2" 31 (FIG. 15). A 'reflection-grating' will generate a counter propagating and distortion removing phase-conjugate laser-beam number "4" 30 of probe-one's 17B (FIG. 15) internal laser-beam number "3" 29 (FIG. 15).

Additionally, as an alternative example, a 'small period-grating' is written within a thin nonlinear material by pump-two's 21B (FIG. 15) internal laser-beam number "1" 27A, 27B (FIG. 15) as it intersects within the thin nonlinear material with probe-one's 17B (FIG. 15) internal laser-bean number "2" 29 (FIG. 15). The resulting interference, will in turn, form a 'small period-grating' 26 at the center of the mixing geometry's thin nonlinear material 18 (FIG. 9).

Moreover, a 'reflection-grating' is written when probe-two's 19B (FIG. 15) internal laser-beam number "1" 31 (FIG. 15) back-scatters off the 'small period-grating' written by pump-two's 21B (FIG. 15) internal laser-beam number "1" 27A, 27B (FIG. 15) as it intersects with probe-one's 17B (FIG. 15) internal laser-beam number "2" 29 (FIG. 15). A 'reflection-grating' will generate a counter propagating and distortion removing phase-conjugate laser-beam number "4" 32 of probe-two's 19B (FIG. 15) internal laser-beam number "3" 31 (FIG. 15). The two phase-conjugated number "4" laser beams 30, 32 generated by the 'reflection-grating' examples are shown by the present invention to be convergent, distortion-free, and plane-parallel.

In addition, as illustrated in FIG. 15, a four-wave mixing geometry is also used to create a second type of spatial grating called 'large period-grating' 26 (FIG. 15). By using the geometry, as illustrated in FIG. 15, the previously mentioned 'large period-grating' is written within a thin nonlinear material 18 (FIG. 9) (e.g., like Ga—As).

For example, a 'large period-grating' is written within a thin nonlinear material 18 by pump-one's 15B (FIG. 15) internal (i.e., internal meaning the laser beams used to produce spatial gratings are created inside the laser cavity containing the thin nonlinear material) laser-beam number "1" 28A, 28B (FIG. 15) as it intersects within the thin nonlinear material 18 with probe-one's 17B (FIG. 15) internal laser-beam number "2" 29 (FIG. 15). The resulting interference, will in turn, form a 'large period-grating' 26 at the center of the mixing geometry's thin nonlinear material 18 (FIG. 9).

Moreover, a 'transmission-grating' is written when probe-two's 19B (FIG. 15) internal laser-beam number "3" 31 (FIG. 15) back-scatters off the 'large period-grating' written by pump-one's 15B (FIG. 15) internal laser-beam number "1" 28A, 28B (FIG. 15) as it intersects with probe-one's 17B (FIG. 15) internal laser-beam number "2" 29 (FIG. 15). A 'transmission-grating' will generate a forward propagating and distortion removing phase-conjugate laser-beam number "4" 30 of probe-two's 19B (FIG. 15) internal laser-beam number "3" 31 (FIG. 15).

Additionally, as an alternative example, a 'large period-grating' is written within a thin nonlinear material 18 by pump-two's 21B (FIG. 15) internal laser-beam number "1" 27A, 27B (FIG. 15) as it intersects within the thin nonlinear material 18 with probe-two's 19B (FIG. 15) internal laser-beam number "2" 31 (FIG. 15). The resulting interference, will in turn, form a 'large period-grating' 26 at the center of the mixing geometry's thin nonlinear material 18 (FIG. 9).

Moreover, a 'transmission-grating' is written when probe-one's 17B (FIG. 15) internal laser-beam number "1" 29 (FIG. 15) back-scatters off the 'large period-grating' written by pump-two's 21B (FIG. 15) internal laser-beam number "1" 27A, 27B (FIG. 15) as it intersects with probe-two's 19B (FIG. 15) internal laser-beam number "2" 31 (FIG. 15). A 'transmission-grating' will generate a forward propagating and distortion removing phase-conjugate laser-beam 32 of probe-one's 17B (FIG. 15) internal laser-beam number "3" 29 (FIG. 15). The two phase-conjugated laser beams 30, 31 generated by the 'transmission-grating' examples are shown by the present invention to be convergent, distortion-free, and plane-parallel.

Furthermore, two phase-conjugate laser beams 30, 32 (FIG. 15) after being generated by the reflection and transmission interference gratings will next cycle between a PCVCSEL's internal reflecting corner-cube prism waveguide 13 (FIGS. 16 and 17) and the PCVCSEL's semi-reflecting quarterwave mirror-stack assembly 23 (FIGS. 7, 8, 9, and 15). The two phase-conjugate laser beams 30, 32 (FIG. 15) are reflected "100" percent by a PCVCSEL's corner-cube prism waveguide backwards "180" degrees toward the PCVCSEL's semi-reflecting quarter-wave mirror-stack assembly 23, which is located at the top of the PCVCSEL's vertical-cavity. Some of the previously mentioned phase-conjugated light will be emitted as frequency selected and wavelength specific laser radiation. For VCSEL devices, because they typically have such short vertical-cavities, it is imperative that the VCSEL's bottom reflector can reflect at least "99.99" percent of the optical radiation produced by the VCSEL's vertical-cavity, or the VCSEL device will suffer from optical loses that will outweigh optical gain, and stimulated emission of laser light will not occur for the VCSEL device, However, a PCVCSEL's corner-cube prism waveguide will reflect a "100" percent all incident optical radiation that enters its front-face surface 13D (FIGS. 16 and 17). This high degree of reflectivity is the result of three internal prism facets 13A, 13B, 13C (FIGS. 16 and 17), which reflect any incident light-ray back parallel into its original direction 33C (FIGS. 16 and 17), no matter what angle of incidence the light-ray entered the front-face surface 13D (FIGS. 16 and 17) of a PCVCSEL's corner-cube prism waveguide 13 (FIGS. 16 and 17).

Therefore, when a light-ray 33 (FIGS. 16 and 17) enters the front-face surface 13D (FIGS. 16 and 17) of a PCVC-SEL's. corner-cube prism waveguide it travels 33A (FIGS. 15, 16, and 17) to one of the three prism faces, for example 13A (FIGS. 15, 16, and 17), which is located at the bottom of the PCVCSEL's corner-cube prism waveguide. Wherein, the previously mentioned light-ray 33 is reflected to a second prism face, for example 13B (FIGS. 15, 16, and 17), where it will be reflected 33B (FIGS. 15, 16, and 17), for example, to a third prism face 13C (FIGS. 15, 16, and 17).

Moreover, after receiving the light-ray 33 the third prism 13C (FIGS. 15, 16, and 17) will reflect it up and out 33C (FIGS. 15, 16, and 17) of the corner-cube prism waveguide's front-face surface 13D (FIGS. 15, 16, and 17) backwards into a PCVCSEL's vertical-cavity, where it will continue to travel until it reaches the PCVCSEL's quarter-wave mirror-stack assembly 23 (FIGS. 7, 8, 9, and 15), who's emitter 24 (FIGS. 7, 8, 9, and 15) will emit some of the PCVCSEL's light as laser radiation. The location of a PCVCSEL's internal reflecting corner-cube prism waveguide is at the base of the PCVCSEL's vertical-cavity 13 (FIGS. 7, 8, 9, and 15), where, it will replace the quarterwave DBR mirror-stack assembly normally used in prior-art VCSEL designs.

Conclusion, Ramifications, and Scope

Although the present invention has been described in detail with references to specific embodiments, various modifications can be made without departing from the scope of the invention.

For example, in order to increase the device's energy (i.e, while decreasing the wavelength) per photon of emitted light, the device's active-regions could contain "Phosphorus" in an amount to form a lattice-matched ternary (InGaAsP) "Indium-Gallium-Arsenic-Phosphide" while another option could be the use of (GaAs) "Gallium-Arsenide" as a quantum well material in a PCVCSEL's various MQW active-areas.

Moreover, another option could be to have a top and/or bottom quarter-wave DBR mirror-stack assembly composed of alternating layers of (AlAs) "Aluminum-Arsenide" and (InGaP) Indium-Gallium-Phosphide" formed thereon. The various materials used along with their combined distributions are interchangeable within this design. The PCVCSEL design is therefore, independent from any semiconductor and optical material or other hybrid material thereof that might be used in a PCVCSEL's construction.

What I claim my invention is:

1. A semiconductor laser, comprising:
a first reflector assembly having an upper face;
a second reflector assembly having a lower face that faces the upper face of the first reflector assembly; and
a phase conjugator between the first and second reflector assemblies, the phase conjugator including:
a first semiconductor active region parallel to the upper face of the first reflector assembly and the lower face of the second reflector assembly;
a second semiconductor active region that is not parallel to the first semiconductor active region wherein the second semiconductor active region is between the first semiconductor active region and the lower face of the second reflector assembly; and
a third semiconductor active region that is not parallel to the first semiconductor active region and wherein the third semiconductor active region is between the first semiconductor active region and the upper face of the first reflector assembly.

2. The semiconductor laser of claim 1, wherein the phase conjugator includes a reflective phase conjugator.

3. The semiconductor laser of claim 1, wherein the phase conjugator includes a transmissive phase conjugator.

4. The semiconductor laser of claim 1, wherein each semiconductor active region includes a nonlinear semiconductor layer.

5. The semiconductor laser of claim 4, wherein the nonlinear semiconductor layer includes a semiconductor material selected from the group consisting of Gallium-Arsenide, Indium-Arsenide, Indium-Phosphide, and Gallium-Antimonide.

6. The semiconductor laser of claim 4, wherein the nonlinear semiconductor layer includes a photorefractive material.

7. The semiconductor laser of claim 6, wherein the photorefractive material is selected from the group consisting of Potassium-Dihydrogen-Phosphate and Ammonium-Dihydrogen-Phosphate.

8. The semiconductor laser of claim 6, wherein the photorefractive material includes a material having a tetragonal crystal-symmetry of class 142d and a space-group of 122.

9. The semiconductor laser of claim 1, wherein the second semiconductor active region is concave shaped and the third semiconductor active region is convex shaped.

10. The semiconductor laser of claim 1, wherein the phase conjugator further includes a fourth semiconductor active region that is parallel to the first semiconductor active region and wherein the fourth semiconductor active region is between the second and third semiconductor active regions.

11. The semiconductor laser of claim 1, wherein the phase conjugator is provided by non-linear four-wave mixing of optical energy oscillating between the first and second reflector assemblies.

12. The semiconductor laser of claim 1, wherein the first semiconductor active region and the second semiconductor active region share a common contact layer.

13. The semiconductor laser of claim 12, wherein the common contact layer includes Gallium-Arsenide.

14. The semiconductor laser of claim 12, wherein the common contact layer includes p+ doped Gallium-Arsenide.

15. The semiconductor laser of claim 1, wherein the first reflector includes a corner cube prism assembly.

16. The semiconductor laser of claim 15, wherein the corned cube prism assembly includes fused silica.

17. The semiconductor laser of claim 15, wherein the second reflector assembly includes a mirror stack.

18. The semiconductor laser of claim 17, wherein the mirror stack comprises a plurality of dielectric layers.

19. The semiconductor laser of claim 17, wherein the second reflector assembly includes a Distributed Bragg Reflector.

20. The semiconductor laser of claim 1, wherein each semiconductor active region includes an active area, and wherein each active area includes at least one nonlinear semiconductor layer.

21. The semiconductor laser of claim 20, wherein at least one of the active areas includes a single quantum well.

22. The semiconductor laser of claim 20, wherein at least one of the active areas includes a multi-quantum well.

23. The semiconductor laser of claim 10, wherein each semiconductor active region includes an active area, and wherein each of the active areas includes a multi-quantum well.

24. The semiconductor laser of claim of claim 17, wherein each semiconductor region includes an active area, and wherein at least one of the active areas includes a multi-quantum well.

25. The semiconductor laser of claim 24, wherein the multi-quantum well includes:
   a plurality of quantum well layers; and
   a plurality of quantum well cladding layers, wherein one quantum well cladding layer is between each pair of adjacent quantum well layers.

26. The semiconductor laser of claim 25, wherein:
   each of the plurality of quantum well layers include Gallium Arsenide; and
   each of the quantum well cladding layers includes Gallium-Aluminum-Arsenide.

27. The semiconductor laser of claim 17, wherein each semiconductor active region includes a multi-quantum well active area.

28. The semiconductor laser of claim 27, wherein each of the multi-quantum wells includes:
   a plurality of quantum well layers; and
   a plurality of quantum well cladding layers, wherein one quantum well cladding layer is between each pair of adjacent quantum well layers.

29. The semiconductor laser of claim 28, wherein:
   each of the plurality of quantum well layers include Gallium Arsenide; and
   each of the quantum well cladding layers includes Gallium-Aluminum-Arsenide.

30. The semiconductor laser of claim 1, wherein the first semiconductor active region is between the second and third semiconductor active regions.

31. The semiconductor laser of claim 10, wherein the first and fourth semiconductor active regions are between the second and third semiconductor active regions.

32. The semiconductor laser of claim 31, wherein the second semiconductor active region is concave shaped and the third semiconductor active region is convex shaped.

33. A semiconductor laser, comprising:
   a first reflector assembly having an upper face;
   a second reflector assembly having a lower face that faces the upper face of the first reflector assembly; and
   means, between the first and second reflector assemblies, for providing a phase conjugator between the first and second reflector assemblies, wherein the means for providing a phase conjugator includes at least two semiconductor active regions that are each not parallel to the upper face of the first reflector assembly.

34. The semiconductor laser of claim 33, wherein the means for providing a phase conjugator includes means for providing a reflective phase conjugator.

35. The semiconductor laser of claim 33, wherein the means for providing a phase conjugator includes means for providing a transmissive phase conjugator.

36. The semiconductor laser of claim 33, wherein the means for providing a phase-conjugate mirror include means for providing a four-wave mixing of optical energy oscillating between the first and second reflector assemblies.

37. The semiconductor laser of claim 33, wherein the first reflector includes a comer cube prism assembly.

38. The semiconductor laser of claim 37, wherein the corner cube prism assembly includes fused silica.

39. The semiconductor laser of claim 37, wherein the second reflector assembly includes a mirror stack.

40. The semiconductor laser of claim 39, wherein the mirror stack comprises a plurality of dielectric layers.

41. The semiconductor laser of claim 39, wherein the second reflector assembly includes a Distributed Bragg Reflector.

42. A vertical cavity surface emitting laser, comprising
a first reflector assembly having an upper face;
a second reflector assembly having a lower face facing the upper face of the first reflector assembly, the first and second reflector assemblies defining a resonant cavity; and
a phase conjugator between the first and second reflector assemblies, the phase conjugator including:
a first semiconductor active region parallel to the upper face of the first reflector assembly and the lower face of the second reflector assembly;
a second semiconductor active region that is not parallel to the first semiconductor active region, wherein the second semiconductor active region is between the first semiconductor active region and the lower face of the second reflector assembly; and
a third semiconductor active region that is not parallel to the first semiconductor active region and wherein the third semiconductor active region is between the first semiconductor active region and the upper face of the first reflector assembly.

43. The vertical cavity surface emitting laser of claim 42, wherein the phase conjugator includes a reflective phase conjugator.

44. The vertical cavity surface emitting laser of claim 42, wherein the phase conjugator includes a transmissive phase conjugator.

45. The vertical cavity surface emitting laser of claim 42, wherein the phase conjugator comprises an interference grating produced by four-wave mixing of optical energy oscillating between the first and second reflector assemblies.

46. The vertical cavity surface emitting laser of claim 42, wherein the first semiconductor active region and the second semiconductor active region share a common contact layer.

47. The vertical cavity surface emitting laser of claim 46, wherein the common contact layer includes Gallium-Arsenide.

48. The vertical cavity surface emitting laser of claim 42, wherein the first reflector includes a corner cube prism assembly.

49. The vertical cavity surface emitting laser of claim 48, wherein the second reflector assembly includes a mirror stack.

50. The vertical cavity surface emitting laser of claim 49, wherein each semiconductor active region includes an active area, wherein each active area includes at least one nonlinear semiconductor layer.

51. The vertical cavity surface emitting laser of claim 49, wherein each semiconductor active region includes a multi-quantum well.

52. The vertical cavity surface emitting laser of claim 51, wherein each of the multi-quantum wells includes:
a plurality of quantum well layers; and
a plurality of quantum well cladding layers, wherein one quantum well cladding layer is between each pair of adjacent quantum well layers.

53. The vertical cavity surface emitting laser of claim 52, wherein:
each of the plurality of quantum well layers include Gallium Arsenide; and
each of the quantum well cladding layers includes Gallium-Aluminum-Arsenide.

54. The vertical cavity surface emitting laser of claim 42, wherein the second semiconductor active region is concave shaped and the third semiconductor active region is convex shaped.

55. The vertical cavity surface emitting laser of claim 42, wherein the phase conjugator further includes a fourth semiconductor active region that is parallel to the first semiconductor active region and wherein the fourth semiconductor active region is between the second and third semiconductor active regions.

56. A device, comprising an array of semiconductor lasers, wherein each semiconductor laser includes:
a first reflector assembly having an upper face;
second reflector assembly having a lower face facing the upper face of the first reflector assembly; and
a phase conjugator between the first and second reflector assemblies, the phase conjugator including:
a first semiconductor active region parallel to the upper face of the first reflector assembly and the lower face of the second reflector assembly;
a second semiconductor active region that is not parallel to the first semiconductor active region and wherein the second semiconductor active region is between the first semiconductor active region and the lower face of the second reflector assembly; and
a third semiconductor active region that is not parallel to the first semiconductor active region and wherein the third semiconductor active region is between the first semiconductor active region and the upper face of the lower reflector assembly.

57. The device of claim 56, wherein the phase conjugator includes a reflective phase conjugator.

58. The device of claim 56, wherein the phase conjugator includes a transmissive phase conjugator.

59. The device of claim 56, wherein each semiconductor active region includes a nonlinear semiconductor layer.

60. The device of claim 56, wherein the semiconductor lasers of the array are simultaneously addressable.

61. The device of claim 56, wherein the semiconductor lasers of the array are individually addressable.

62. The device of claim 56, wherein the second semiconductor active region is concave shaped and the third semiconductor active region is convex shaped.

63. The device of claim 56, herein the phase conjugator further includes a fourth semiconductor active region that is parallel to the first semiconductor active region and wherein the fourth semiconductor active region is between the second and third semiconductor active regions.

* * * * *